(12) United States Patent
Miyake et al.

(10) Patent No.: US 7,885,304 B2
(45) Date of Patent: Feb. 8, 2011

(54) NITRIDE-BASED SEMICONDUCTOR LASER DEVICE AND METHOD OF MANUFACTURING THE SAME

(75) Inventors: Yasuto Miyake, Hirakata (JP); Ryoji Hiroyama, Kyo-tanabe (JP); Masayuki Hata, Kadoma (JP); Yasumitsu Kuno, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 65 days.

(21) Appl. No.: 12/415,647

(22) Filed: Mar. 31, 2009

(65) Prior Publication Data

US 2009/0245310 A1    Oct. 1, 2009

(30) Foreign Application Priority Data

Mar. 31, 2008  (JP) .............................. 2008-090124
Mar. 19, 2009  (JP) .............................. 2009-067213

(51) Int. Cl.
  *H01S 5/00*     (2006.01)
(52) U.S. Cl. .................. 372/43.01; 372/39; 372/44.01; 372/49.01
(58) Field of Classification Search .................. 372/39, 372/43.01, 44.01
  See application file for complete search history.

(56) References Cited

U.S. PATENT DOCUMENTS 6,100,106 A    8/2000    Yamaguchi et al.

2008/0273562 A1 *  11/2008  Hasegawa et al. ......... 372/44.01
2008/0283846 A1    11/2008  Ohmae et al.
2009/0052489 A1 *  2/2009  Nomura ................... 372/49.01

FOREIGN PATENT DOCUMENTS

| JP | 8213692 A | 8/1996 |
|---|---|---|
| JP | 11150335 A | 6/1999 |
| JP | 200816685 A | 1/2008 |
| JP | 2008288461 A | 11/2008 |
| JP | 2008542183 A | 11/2008 |
| WO | 2006130623 A2 | 7/2006 |

OTHER PUBLICATIONS

Okamoto et al., Continuous-Wave Operation of m-Plane InGaN Multiple Quantum Well Laser Diodes, JJAP Express Letter, Feb. 23, 2007, vol. 46, No. 9, pp. L187-L189, Japanese Journal of Applied Physics, Japan.

* cited by examiner

*Primary Examiner*—Dung T Nguyen
(74) *Attorney, Agent, or Firm*—Ditthavong Mori & Steiner, P.C.

(57) ABSTRACT

A nitride-based semiconductor laser device includes a nitride-based semiconductor layer formed on a main surface of a substrate and having an emission layer, wherein the nitride-based semiconductor layer includes a first side surface formed by a (000-1) plane and a second side surface inclined with respect to the first side surface, and a ridge having an optical waveguide extending perpendicular to a [0001] direction in an in-plane direction of the main surface of the substrate is formed by a region held between the first side surface and the second side surface.

15 Claims, 12 Drawing Sheets

NITRIDE-BASED SEMICONDUCTOR LASER DEVICE AND METHOD OF MANUFACTURING THE SAME

CROSS-REFERENCE TO RELATED APPLICATIONS

The priority application numbers JP2008-90124, Nitride-Based Semiconductor Laser Device and Method of Manufacturing the Same, Mar. 31, 2008, Yasuto Miyake et al, JP2009-67213, Nitride-Based Semiconductor Laser Device and Method of Manufacturing the Same, Mar. 19, 2009, Yasuto Miyake et al, upon which this patent application is based are hereby incorporated by reference.

BACKGROUND OF THE INVENTION

1. Field of the Invention

The present invention relates to a nitride-based semiconductor laser device and a method of manufacturing the same, and more particularly, it relates to a nitride-based semiconductor laser device provided with an optical waveguide and a method of manufacturing the same.

2. Description of the Background Art

In general, a light-emitting device made of a nitride-based material such as gallium nitride (GaN) has been put into practice as a 405 nm blue-violet semiconductor laser (LD) as a light source for recording/playing employed as a DVD system. A semiconductor laser device emitting blue or green light, employing a nitride-based material has been developed. Considering that luminous efficiency is reduced due to an influence of large piezoelectric field in a light-emitting device formed on a polar face ((0001) plane) of a GaN substrate, a nitride-based semiconductor laser device formed with a light-emitting device layer on a nonpolar face ((1-100) plane or (11-20) plane) of a GaN substrate has been proposed. Such a nitride-based semiconductor laser device is disclosed in Japanese Patent Laying-Open No. 8-213692 and Japanese Journal of Applied Physics Vol. 46, No. 9, 2007, pp. L187-L189.

The nitride-based semiconductor laser device disclosed in the aforementioned Japanese Patent Laying-Open No. 8-213692 and Japanese Journal of Applied Physics Vol. 46, No. 9, 2007, pp. L187-L189 has a striped ridge as an optical waveguide. A resist is employed as a mask for dry etching such as reactive ion etching (RIE), or inductively coupled plasma (ICP) etching, thereby forming this ridge.

When the ridge is formed by dry etching as in the nitride-based semiconductor laser device disclosed in the aforementioned Japanese Patent Laying-Open No. 8-213692 and Japanese Journal of Applied Physics Vol. 46, No. 9, 2007, pp. L187-L189, however, the side walls of the ridge are not sufficiently flattened. When the side walls of the ridge are not sufficiently flattened, a horizontal transverse mode is disadvantageously unstable. When the horizontal transverse mode is unstable, a far-field pattern (FFP) is likely to be asymmetric and kink (nonlinearity) in I-L characteristics disadvantageously occurs.

SUMMARY OF THE INVENTION

A nitride-based semiconductor laser device according to a first aspect of the present invention comprises a nitride-based semiconductor layer formed on a main surface of a substrate and having an emission layer, the nitride-based semiconductor layer comprises a first side surface formed by a (000-1) plane and a second side surface inclined with respect to the first side surface, and one or a plurality of ridges extending perpendicular to a [0001] direction in an in-plane direction of the main surface of the substrate is formed by a region held between the first side surface and the second side surface, and at least the one ridge has an optical waveguide.

In this nitride-based semiconductor laser device according to the first aspect, as hereinabove described, the nitride-based semiconductor layer including the first side surface formed by the (000-1) plane is formed, whereby the side surface (first side surface) of the nitride-based semiconductor layer having excellent flatness can be obtained. At least the one ridge having at least one side surface which is the first side surface having excellent flatness has the optical waveguide, whereby the nitride-based semiconductor laser device having the optical waveguide, the side surface of which has the excellent flatness, can be obtained dissimilarly to a case where the waveguide is formed by dry etching. Thus, the nitride-based semiconductor laser device having a stable horizontal transverse mode can be obtained.

In the aforementioned nitride-based semiconductor laser device according to the first aspect, the first side surface and the second side surface are preferably formed by crystal growth facets of the nitride-based semiconductor layer. According to this structure, the ridge having the optical waveguide can be formed simultaneously with crystal growth of the nitride-based semiconductor layer. Thus, the optical waveguide can be formed without dry etching, and hence the manufacturing process can be simplified and the nitride-based semiconductor layer can be prevented from damage by dry etching. Accordingly, deterioration of performance of the nitride-based semiconductor laser device due to damage by etching can be suppressed.

In the aforementioned nitride-based semiconductor laser device according to the first aspect, the second side surface is preferably formed by a (A+B, A, −2A−B, 2A+B) plane (A and B satisfy A≧0 and B≧0, and either one of A and B is a nonzero integer). According to this structure, the second side surface formed by the (A+B, A, −2A−B, 2A+B) plane can be easily formed in addition to the first side surface formed by the (000-1) plane by growing the nitride-based semiconductor layer on the substrate on which the recess portions are formed.

In the aforementioned structure in which the second side surface is formed by the (A+B, A, −2A−B, 2A+B), the second side surface is preferably formed by a (10-11) plane or a (11-22) plane. According to this structure, faces of the side surfaces of theses planes are a nitrogen face (N-face) and have excellent flatness. This reason is conceivable as follows:

The plane having slow growth rate such as the (000-1) plane or the (A+B, A, −2A−B, 2A+B) plane conceivably has low surface energy, and the plane having fast growth rate such as the (1-100) plane conceivably has high surface energy. The surface during crystal growth is stable when the energy is lower, and hence the plane other the (1-100) plane is likely to appear. Consequently, flatness of the surface is likely to be deteriorated. According to this embodiment, on the other hand, when the (1-100) plane is grown while forming the (000-1) plane or the (A+B, A, −2A−B, 2A+B) plane having surface energy lower than the (1-100) plane grown as the main surface, surface energy can be reduced as compared with a case of crystal growing only the (1-100) plane as a growth plane, and hence flatness of the growth plan is conceivably improved.

In the aforementioned nitride-based semiconductor laser device according to the first aspect, at least one of the first side surface and the second side surface are preferably inclined with respect to the main surface of the substrate so that a plane area of the nitride-based semiconductor layer is reduced in a direction away from the substrate along a direction of stacking of the nitride-based semiconductor layer, in the nitride-based semiconductor layer. According to this structure, a region where no nitride-based semiconductor layer exists by the first side surface and the second side surface (region where the first side surface and the second side surface are opposed to each other in a wafer state) is formed on the surface of the semiconductor layer on a side opposite to the substrate, and hence the wafer can be easily divided between the first side surface and the second side surface when the laser device is separated into chips.

In the aforementioned nitride-based semiconductor laser device according to the first aspect, at least one of the first side surface and the second side surface is preferably formed at a slant so as to form an obtuse angle with respect to a main surface of the nitride-based semiconductor layer. According to this structure, the first side surface and the second side surface can be inhibited from coming close to each other, and hence the device can be easily cut between the first side surface and the second side surface when separating the device into chips.

In the aforementioned nitride-based semiconductor laser device according to the first aspect, the substrate is preferably made of a nitride-based semiconductor. According to this structure, the first side surface and the second side surface can be easily formed, when the nitride-based semiconductor layer is grown on the substrate made of the nitride-based semiconductor.

In the aforementioned nitride-based semiconductor laser device according to the first aspect, at least two recess portions are preferably formed on the main surface of the substrate, the first side surface is preferably formed starting from an inner side surface of one of the recess portions in two of the recess portions adjacent to each other, and the second side surface is preferably formed starting from an inner side surface of the other recess portion in the two recess portions adjacent to each other. According to this structure, the nitride-based semiconductor layer is formed on the main surface of the substrate formed with the recess portions, whereby the first side surface formed by the (000-1) plane, having excellent flatness can be formed starting from the one of the recess portions in the two recess portions adjacent to each other when growing the nitride-based semiconductor layer, and the second side surface having excellent flatness can be formed starting from the other recess portion in the two recess portions adjacent to each other. The optical waveguide is formed by the region held between the first side surface and the second side surface, having the excellent flatness, whereby the nitride-based semiconductor laser device having the optical waveguide, the side surface of which has the excellent flatness, can be obtained dissimilarly to a case where the waveguide is formed by dry etching. Thus, the nitride-based semiconductor laser device having a stable horizontal transverse mode can be obtained.

In this case, the inner side surface of the one of the recess portions, formed with the first side surface preferably includes a (000-1) plane. According to this structure, the (000-1) plane of the nitride-based semiconductor layer is so formed as to start from the inner side surface formed by the (000-1) plane when the nitride-based semiconductor layer having the first side surface formed by the (000-1) plane is formed on the main surface of the substrate, and hence the first side surface formed by the (000-1) plane can be easily formed on the surface of the substrate.

In the aforementioned nitride-based semiconductor laser device according to the first aspect, a support portion is preferably formed on the main surface of the substrate in the lateral direction from the ridge having the optical waveguide. According to this structure, the semiconductor layer side of the nitride-based semiconductor laser device can be reliably bonded to a base or the like by utilizing the support portion.

In the aforementioned structure comprising the support portion, the support portion preferably has a plane area larger than a plane area of the ridge having the optical waveguide held between the first side surface and the second side surface. According to this structure, impact force in bonding the nitride-based semiconductor laser device to the base or the like can be inhibited from directly influencing the region where the optical waveguide is formed, by utilizing the support portion having the larger plan area.

In this case, the nitride-based semiconductor laser device preferably further comprises an ohmic electrode formed on a surface of the ridge having the optical waveguide, and a pad electrode electrically connected to the ohmic electrode and extending on a portion from a surface of the ohmic electrode to the support portion. According to this structure, a metal wire can be easily wire-bonded onto a region corresponding to the support portion in the pad electrode.

In the aforementioned structure comprising the pad electrode, the pad electrode preferably has a wire bonding region on the support portion. According to this structure, the wire-bonding position of the metal wire is on the support portion different from the emission region in the pad electrode, and hence impact force in wire-bonding can be inhibited from directly influencing the emission region.

In the aforementioned nitride-based semiconductor laser device according to the first aspect, the substrate preferably includes a base substrate and an underlayer made of AlGaN formed on the base substrate, a lattice constant of the base substrate is preferably larger than a lattice constant of the underlayer, the recess portions include cracks formed on the underlayer, and the first side surface and the second side surface are preferably formed starting from inner side surfaces of the crack formed to extend substantially parallel to a (000-1) plane of the underlayer and the main surface of the substrate respectively. According to this structure, the lattice constant of the underlayer is smaller than the lattice constant of the base substrate, and hence tensile stress can be caused inside the underlayer when forming the underlayer made of AlGaN on the base substrate. The cracks as the recess portions can be easily formed on the surface of the underlayer by this tensile stress, and hence the first side surface and the second side surface can be formed starting from the cracks.

A method of manufacturing a nitride-based semiconductor laser device according to a second aspect of the present invention comprises steps of forming at least two recess portions on a main surface of a substrate, and forming a nitride-based semiconductor layer having an emission layer on the main surface of the substrate, wherein the step of forming the nitride-based semiconductor layer includes a step of forming a first side surface formed by a (000-1) plane of the nitride-based semiconductor layer starting from an inner side surface of one of the recess portions in adjacent two of the recess portions and forming a second side surface of the nitride-based semiconductor layer starting from an inner side surface of the other the recess portion in the adjacent two recess portions, thereby forming one or a plurality of ridges by a region held between the first side surface and the second side surface.

In this method of manufacturing a nitride-based semiconductor laser device according to the second aspect, as hereinabove described, the nitride-based semiconductor layer is formed on the main surface of the substrate formed with the recess portions, whereby when growing the nitride-based semiconductor layer, the first side surface formed by the (000-1) plane, having excellent flatness, can be formed starting from one of the recess portions in the two recess portions adjacent to each other, and the second side surface having excellent flatness can be formed starting from the other recess portion in the two recess portions adjacent to each other. The ridge having the optical waveguide is formed by the region held between these first and second side surfaces having excellent flatness, whereby the nitride-based semiconductor laser device having the optical waveguide, side surfaces of which have excellent flatness, can be obtained dissimilarly to a case of forming the optical waveguide by dry etching. Thus, the nitride-based semiconductor laser device having a stable horizontal transverse mode can be obtained.

The aforementioned method of manufacturing a nitride-based semiconductor laser device according to the second aspect preferably further comprises a step of separating into chips by dividing the nitride-based semiconductor layer into individual semiconductor laser devices on a region where the first side surface and the second side surface are opposed to each other, wherein the step of separating into chips includes a step of separating into chips by dividing the substrate into the individual semiconductor laser devices on bottom portions of the recess portions of the region where the first side surface and the second side surface are opposed to each other. According to this structure, a thickness of the substrate on the bottom portions of the recess portions is smaller than a thickness of the substrate on portions other than the bottom portions of the recess portions, and hence the device in a wafer state can be easily divided on portions of the substrate having a smaller thickness.

In the aforementioned method of manufacturing a nitride-based semiconductor laser device according to the second aspect, the step of growing the nitride-based semiconductor layer preferably includes a step of growing the nitride-based semiconductor layer so that the plane area of the nitride-based semiconductor layer is reduced in a direction away from the substrate along a thickness direction of the nitride-based semiconductor layer by inclining at least one of the first side surface and the second side surface with respect to the main surface of the substrate. According to this structure, the region (where the first side surface and the second side surface are opposed to each other in a wafer state) larger than the plane area of each recess portion of the substrate is formed on the surface of the semiconductor layer opposite to the substrate by the first side surface and the second side surface, and hence the wafer can be easily divided between the first side surface and the second side surface when separating the laser device into chips.

In the aforementioned method of manufacturing a nitride-based semiconductor laser device according to the second aspect, the substrate preferably includes a base substrate and an underlayer formed on the base substrate, and the step of forming the recess portions preferably includes a step of forming the recess portions on the underlayer. According to this structure, the nitride-based semiconductor layer having the first side surface formed by the (000-1) plane can be easily so formed as to start from the inner side surfaces of the recess portions by utilizing the recess portions formed on the underlayer when the nitride-based semiconductor layer is formed on the main surface of the base substrate.

In this case, the underlayer preferably includes an AlGaN layer, $c_1$ and $c_2$ preferably satisfy relation of $c_1 > c_2$ when lattice constants of the base substrate and the underlayer are $c_1$ and $c_2$ respectively, and the step of forming the recess portions preferably includes a step of forming the recess portions formed by one of planes of a crack formed substantially parallel to a (0001) plane on the underlayer. According to this structure, when forming the underlayer made of AlGaN on the base substrate, the lattice constant $c_2$ of the underlayer is smaller than the lattice constant $c_1$ of the base substrate ($c_1 > c_2$), and hence tensile stress is caused inside the underlayer in response to the lattice constant $c_1$ of the base substrate. Consequently, the underlayer can not withstand this tensile stress, and hence the crack is formed on the underlayer along the (000-1) plane when the thickness of the underlayer is at least a prescribed thickness. Thus, a facet formed by (000-1) plane which is the basis for forming the (000-1) plane of the nitride-based semiconductor layer on the underlayer can be easily formed on the underlayer. Consequently, the nitride-based semiconductor layer having the first side surface formed by the (000-1) plane can be easily formed to start from the (000-1) facet formed by one of the planes of the crack formed on the underlayer when forming the nitride-based semiconductor layer on the substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be hereinafter described with reference to the drawings.

A structure of a nitride-based semiconductor laser device 10, which is an example of a nitride-based semiconductor laser device according to the present invention will be schematically described with reference to FIG. 1, before specifically illustrating the embodiments of the present invention.

Figure 1:
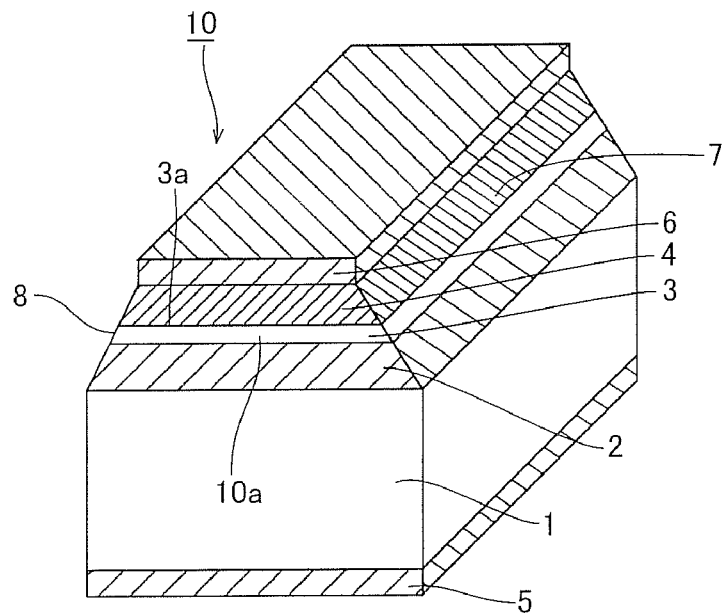
FIG. 1 is a bird's-eye view for schematically illustrating a structure of a nitride-based semiconductor laser device according to the present invention.

In the nitride-based semiconductor laser device 10, a first semiconductor layer 2 is formed on a growth substrate 1 and an emission layer 3 is formed on a first semiconductor layer 2, as shown in FIG. 1. A second semiconductor layer 4 is formed on the emission layer 3. A first electrode 5 is formed on a lower surface of the growth substrate 1, and a second electrode 6 is formed on the second semiconductor layer 4. The first semiconductor layer 2, the emission layer 3 and the second semiconductor layer 4 are formed in a mesa shape having a first side surface 7 and a second side surface 8 to extend parallel to a direction perpendicular to the plane of FIG. 1. The first side surface 7 and the second side surface 8 are formed by crystal growth facets and have high flatness. A ridge having an optical waveguide is formed by a region held between these first and second side surfaces 7 and 8. Cavity facets 10a are formed by a (−A, A+B, −B, 0) plane, and the optical waveguide extends perpendicular to a [0001] direction in a [−A, A+B, −B, 0] direction which is an in-plane direction of a main surface of the substrate (growth substrate 1). The first side surface 7 is formed by a (000-1) plane and the second side surface 8 is formed by a (A+B, A, −2A−B, 2A+B) plane (A and B satisfy A≧0 and B≧0, and either one of A and B is a nonzero integer). The growth substrate 1 is an example of the "substrate" in the present invention. The first semiconductor layer 2, the emission layer 3 and the second semiconductor layer 4 are examples of the "nitride-based semiconductor layer" in the present invention.

In general, the emission layer 3 having a band gap smaller than band gaps of the growth substrate 1 and the second semiconductor layer 4 is formed between the growth substrate 1 and the second semiconductor layer 4 for forming a double hetero structure, so that carriers can be likely to be confined in the emission layer 3 and luminous efficiency of the nitride-based semiconductor laser device 10 can be improved. The emission layer 3 is formed to have a single quantum well (SQW) structure or a multiple quantum well (MQW) structure, whereby luminous efficiency can be improved. In the case of these quantum well structures, a thickness of a well layer is small, and hence deterioration of crystallinity of the well layer can be suppressed also when the well layer has strain. Deterioration of crystallinity is suppressed also when the well layer has compressive strain in the in-plane directions of a main surface 3a of the emission layer 3 or has tensile strain in the in-plane directions thereof. The emission layer 3 may be undoped or doped.

In the present invention, the growth substrate 1 may be formed by a substrate or a semiconductor layer, or may be formed by both of the substrate and the semiconductor layer. When the growth substrate 1 is formed by both of the substrate and the semiconductor layer, the semiconductor layer is formed between the substrate and the first semiconductor layer 2. The growth substrate 1 may be employed as a support substrate for supporting the semiconductor layer on a growth surface (main surface) of the semiconductor layer after growing the semiconductor layer.

A GaN substrate or an α-SiC substrate can be employed as the substrate. A nitride-based semiconductor layer having a main surface having an identical surface orientation with the substrate is formed on the GaN substrate and the α-SiC substrate. For example, nitride-based semiconductor layers having main surfaces formed by an a-plane and an m-plane are formed on the a-plane and the m-plane of the α-SiC substrate respectively. An r-plane sapphire substrate formed with a nitride-based semiconductor having a main surface formed by the a-plane may be employed as the substrate. A LiAlO$_2$ substrate or a LiGaO$_2$ substrate formed with the nitride-based semiconductor layers having the main surfaces formed by the a-plane and the m-plane can be employed as the substrate.

In the p-n junction nitride-based semiconductor laser device 10, the first semiconductor layer 2 and the second semiconductor layer 4 have different conductivity type. The first semiconductor layer 2 may be p-type and the second semiconductor layer 4 may be n-type, or the first semiconductor layer 2 may be n-type and the second semiconductor layer 4 may be p-type.

The first semiconductor layer 2 and the second semiconductor layer 4 may include cladding layers (not shown) having band gaps larger than that of the emission layer 3. Further, each of the first semiconductor layer 2 and the second semiconductor layer 4 may include a cladding layer and a contact layer (not shown) successively from a side of the emission layer 3. In this case, the contact layer preferably has a smaller band gap than the cladding layer.

In the emission layer 3 of the quantum well, GaInN can be employed as a well layer, and AlGaN, GaN and GaInN having band gaps larger than that of the well layer can be employed as the barrier layer. GaN and AlGaN can be employed as the cladding layer and the contact layer. The second electrode 6 may be formed on a part of a region on the second semiconductor layer 4.

The surface orientation of the substrate of the nitride-based semiconductor laser device according to the present invention will be now described with reference to FIG. 2.

Figure 2:
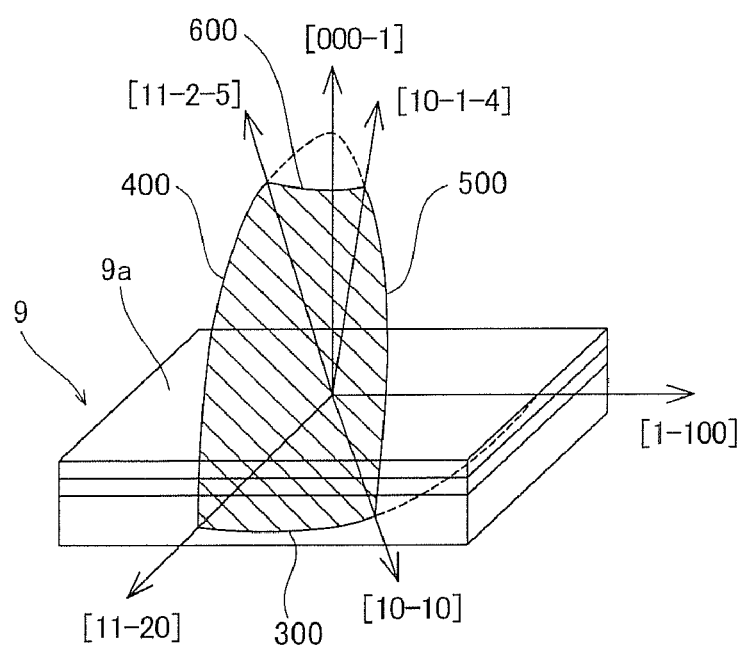
FIG. 2 is a diagram for illustrating the surface orientation of a substrate employed in the nitride-based semiconductor laser device according to the present invention.

As shown in FIG. 2, a normal direction of a main surface 9a of a substrate 9 is a direction passing through an area enclosed with a line 300, a line 400, a line 500 and a line 600 (region hatched by slant lines). The line 300 is a line connecting a [11-20] direction and a substantially [10-10] direction and the direction passing through the line 300 is a [C+D, C, −2C−D, 0] direction (C and D satisfy C≧0 and D≧0, and at least either one of C and D is a nonzero integer). The line 400 is a line connecting a [11-20] direction and a substantially [11-2-5] direction, and the direction passing through the line 400 is a [1, 1, −2, −E] direction (0≦E≦5)). The line 500 is a line connecting a [10-10] direction and a substantially [10-1-4] direction, and the direction passing through the line 500 is a [1, −1, 0, −F] direction (0≦F≦4)). The line 600 is a line connecting a substantially [11-2-5] direction and a substantially [10-1-4] direction, and the direction passing through the line 600 is a [G+H, G, −2G−H, −5G−4H] direction (G and H satisfy G≧0 and H≧0, and at least either one of G and H is a nonzero integer)).

According to the present invention, as hereinabove described, the semiconductor layer (the first semiconductor layer 2, the emission layer 3 and the second semiconductor layer 4) including the first side surface 7 formed by the (000-1) plane is formed, whereby the side surface (first side surface 7) of the semiconductor layer having excellent flatness can be obtained.

Further, the semiconductor layer (the first semiconductor layer 2, the emission layer 3 and the second semiconductor layer 4) including the second side surface 8 formed by a (A+B, A, −2A−B, 2A+B) plane (A and B satisfy A≧0 and B≧0, and either one of A and B is a nonzero integer) is formed, whereby another side surface (second side surface 8) of the semiconductor layer having excellent flatness can be obtained. The optical waveguide is formed by the first side surface 7 or the first and second side surfaces 7 and 8 having excellent flatness, whereby the nitride-based semiconductor laser device 10 having the optical waveguide, the side surface of which has the excellent flatness, can be obtained dissimilarly to a case where the waveguide is formed by dry etching. Thus, the nitride-based semiconductor laser device 10 having a stable horizontal transverse mode can be obtained.

The first side surface 7 and the second side surface 8 are formed to extend along an extensional direction of the waveguide, whereby the ridge having the waveguide for emitting a laser beam, which is emitted from the emission layer 3, outward can be easily formed by the first side surface 7 and the second side surface 8 formed by the semiconductor layer (the first semiconductor layer 2, the emission layer 3 and the second semiconductor layer 4).

A crystal plane having a prescribed plane direction is employed on the side surface of the growth substrate 1, whereby the (000-1) plane of the semiconductor layer is formed by starting from the side surface of the growth substrate having the aforementioned prescribed plane direction when the semiconductor layer having the first side surface 7 formed by the (000-1) plane is formed on the main surface of the growth substrate 1, for example, and hence the first side surface 7 formed by the (000-1) plane can be easily formed on the surface of the growth substrate 1.

In the schematic structure, the side of the second side surface 8 is etched, whereby the width of the optical waveguide may be controlled to be reduced in a state of remaining the first side surface 7. This etching may be etching up to a part of the second semiconductor 4 or etching up to a portion reaching the first semiconductor layer 2.

Embodiments embodying the aforementioned concept of the present invention will be hereinafter described with reference to the drawings.

First Embodiment

A structure of a nitride-based semiconductor laser device 30 according to a first embodiment will be now described with reference to FIG. 3.

This nitride-based semiconductor laser device 30 according to the first embodiment is formed by employing a wurtzite nitride semiconductor having a main surface formed by a (11-2-2) plane. As shown in FIG. 3, a light-emitting device layer 15 including an n-type cladding layer 12, an emission layer 13, a p-type cladding layer 14 is formed on an n-type GaN substrate 11 having a thickness of about 100 μm. The n-type cladding layer 12 is made of n-type $Al_{0.05}Ga_{0.95}N$, having a thickness of about 2.2 μm. The emission layer 13 has an MQW structure in which a well layer (not shown) made of $Ga_{0.7}In_{0.3}N$ having a thickness of about 3 nm and a barrier layer (not shown) made of GaN having a thickness of about 20 nm are stacked. The p-type cladding layer 14 is made of p-type $Al_{0.05}Ga_{0.95}N$ having a thickness of about 0.5 μm. The n-type GaN substrate 11 is an example of the "substrate" in the present invention, and the light-emitting device layer 15 is an example of the "nitride-based semiconductor layer" in the present invention. A buffer layer (not shown) made of n-type $Al_{0.01}Ga_{0.99}N$ may be formed between the n-type GaN substrate 11 and the n-type cladding layer 12, or light guide layers (not shown) may be formed between the emission layer 13, the n-type cladding layer 12 and the p-type cladding layer 14, respectively. A cap layer (not shown) may be formed between the emission layer 13 and the p-type cladding layer 14.

According to the first embodiment, first side surfaces 15a formed by a (000-1) plane of the light-emitting device layer 15 and second side surfaces 15b formed by a (11-22) plane of the light-emitting device layer 15 are formed on the light-emitting device layer 15 to extend in a [1-100] direction. The first and second side surfaces 15a and 15b are sides of trapezoidal shapes inclined in directions opposite to each other, and the first and second side surfaces 15a and 15b are formed as inclined planes inclined by inclination angles α (obtuse angle of about 122°) and β (obtuse angle of about 116°) with respect to an upper surface (main surface) of the light-emitting device layer 15, respectively. These first and second side surfaces 15a and 15b are formed by crystal growth facets of the light-emitting device layer 15.

A plurality of groove-shaped recess portions 11a extending in the [1-100] direction (direction B) are formed on an upper surface of the n-type GaN substrate 11. The recess portions 11a have a depth L which is at least a thickness of the light-emitting device layer 15 and a width W1 of at most 10 μm, and are formed at an interval D1 of about 2 to 4 μm. The first and second side surfaces 15a and 15b are formed starting from inner side surfaces 11b and 11c on first and second sides of the recess portions 11a respectively. According to the first embodiment, a ridge 35 extending in the [1-100] direction, functioning as an optical waveguide of the nitride-based semiconductor laser device 30 and a plurality of dummy ridges 36 formed on both sides of the ridge 35, not functioning as waveguides are formed by regions held between the first side surfaces 15a formed starting from the inner side surfaces 11b on the first sides of ones of the recess portions 11a in the adjacent recess portions 11a and the second side surfaces 15b formed starting from the inner side surfaces 11c on the second sides of the other recess portions 11a in the adjacent recess portions 11a. In other words, the side surfaces on the both sides of the ridge 35 having the optical waveguide is formed by the first side surface 15a and the second side surface 15b. Cavity facets (not shown) are formed by cleavage planes of (1-100) and (-1100) planes.

Insulating films 16 made of $SiO_2$ fill up the recess portions 11a and regions between the first and second side surfaces 15a and 15b formed starting from the recess portions 11a. A current blocking layer 17 made of $SiO_2$ is formed to cover an upper surface of the light-emitting device layer 15 and upper surfaces of the insulating films 16. A p-side ohmic electrode 18 including a Pt layer having a thickness of about 5 nm, a Pd layer having a thickness of about 100 nm and an Au layer having a thickness of about 150 nm from a lower layer toward an upper layer is formed on the ridge 35 without forming the current blocking layer 17, so as to be in contact with the ridge 35. A p-side pad electrode 19 including a Ti layer having a thickness of about 5 nm and an Au layer having a thickness of about 300 nm from a lower layer toward an upper layer is formed on the p-side ohmic electrode 18.

On a lower surface of the n-type GaN substrate 11, an n-side ohmic electrode 20 including an Al layer having a thickness of about 5 nm, a Pd layer having a thickness of about 10 nm and an Au layer having a thickness of about 300 nm from a side of the device toward a lower layer is formed on a region corresponding to a region formed with the p-side ohmic electrode 18, and insulating films 21 are formed on regions other than the region. An n-side pad electrode 22 including a Ti layer having a thickness of about 5 nm and an Au layer having a thickness of about 300 nm from a lower layer toward an upper layer is formed on the n-side ohmic electrode 20. According to the first embodiment, a width of the ridge 35 (interval D1 of the adjacent recess portions 11a) is small, about 2 to 4 μm, and hence handling of the device is difficult when the device is separated into chips to include the single ridge 35. Accordingly, the nitride-based semiconductor laser device 30 is separated into chips so as to include the single ridge 35 and the plurality of dummy ridges 36, whereby the nitride-based semiconductor laser device 30 has a width of about 200 to 400 μm and the p-side ohmic electrode 18 and the n-side ohmic electrode 20 are formed only on the ridge 35 employed as the optical waveguide.

A manufacturing process for the nitride-based semiconductor laser device 30 according to the first embodiment will be now described with reference to FIGS. 3 to 6.

Figure 4:
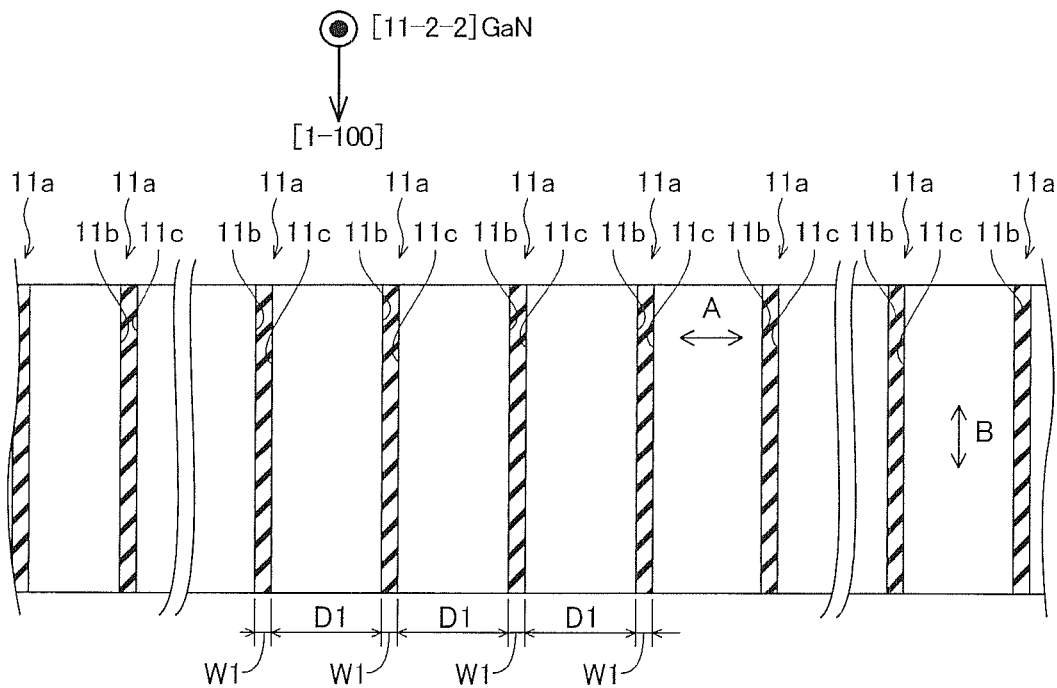
FIG. 4 is a plan view for illustrating a manufacturing process for the nitride-based semiconductor laser device according to the first embodiment shown in FIG. 3.
Figure 5:
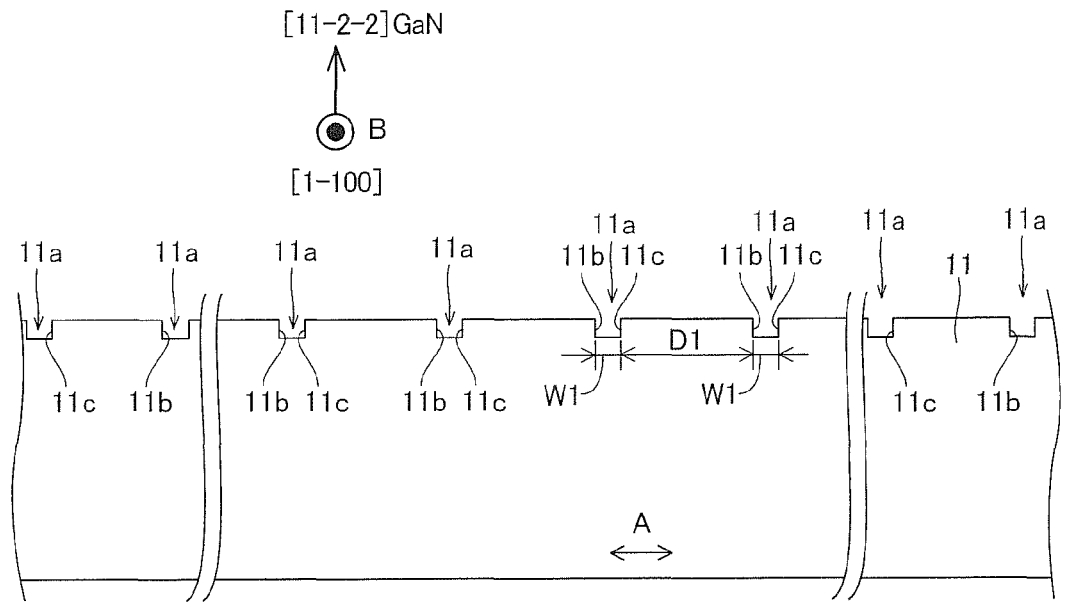
FIGS. 5 and 6 are sectional views for illustrating the manufacturing process for the nitride-based semiconductor laser device according to the first embodiment shown in FIG. 3.

As shown in FIGS. 4 and 5, a plurality of the groove-shaped recess portions 11a having the width W1 of about 5 μm in the [0001] direction (direction A) and a depth of about 2 μm and extending in the [1-100] direction (direction B) are formed on the main surface, formed by the (11-2-2) plane, of the n-type GaN substrate 11 at the interval D of about 4 μm by etching. In FIG. 4, portions of bold slant lines (hatched portions) are regions which are etched as the recess portions 11a. The recess portions 11a are formed in a striped manner in the direction A in a period of about 9 μm (=W1+D1).

Figure 6:
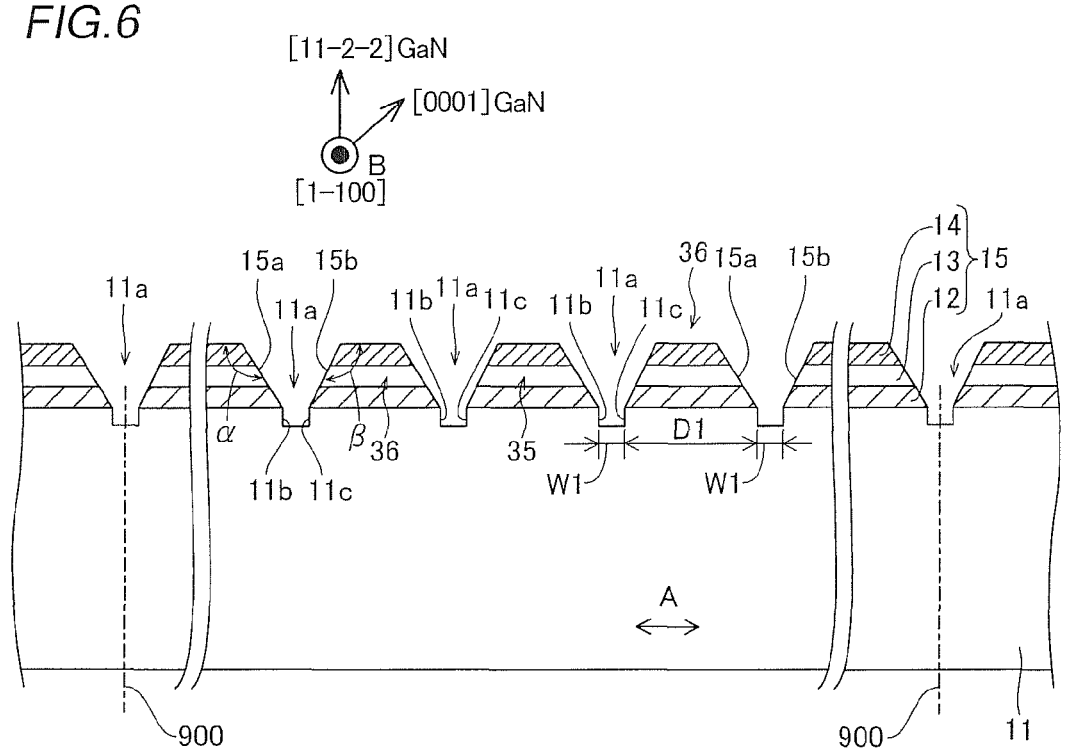

As shown in FIG. 6, the n-type cladding layer 12, the emission layer 13 and the p-type cladding layer 14 are successively staked on the n-type GaN substrate 11 formed with the groove-shaped recess portions 11a by metal organic chemical vapor deposition (MOCVD), thereby forming the light-emitting device layer 15.

At this time, according to the first embodiment, the light-emitting device layer 15 is grown starting from the inner side surfaces 11b of the recess portions 11a extending in the [1-100] direction (direction B in FIG. 4) while forming facets formed by the (000-1) plane extending in a direction inclined by a prescribed angle with respect to a [11-2-2] direction of the n-type GaN substrate 11. Further, the light-emitting device layer 15 is grown starting from the inner side surfaces 11c of the recess portions 11a while forming facets formed by the (11-22) plane extending in a direction inclined by a prescribed angle with respect to the [11-2-2] direction of the n-type GaN substrate 11. Thus, the first and second side surfaces 15a and 15b are formed so as to form obtuse angles (inclination angles α and β) with respect to the upper surface (main surface) of the light-emitting device layer 15. According to the first embodiment, the single ridge 35 and the plurality of dummy ridges 36 are formed by the regions held between the first side surfaces 15a formed starting from the inner side surfaces 11b of ones of the recess portions 11a in the adjacent recess portions 11a and the second side surfaces 15b formed starting from the inner side surfaces 11c of the other recess portions 11a in the adjacent recess portions 11a.

Figure 3:
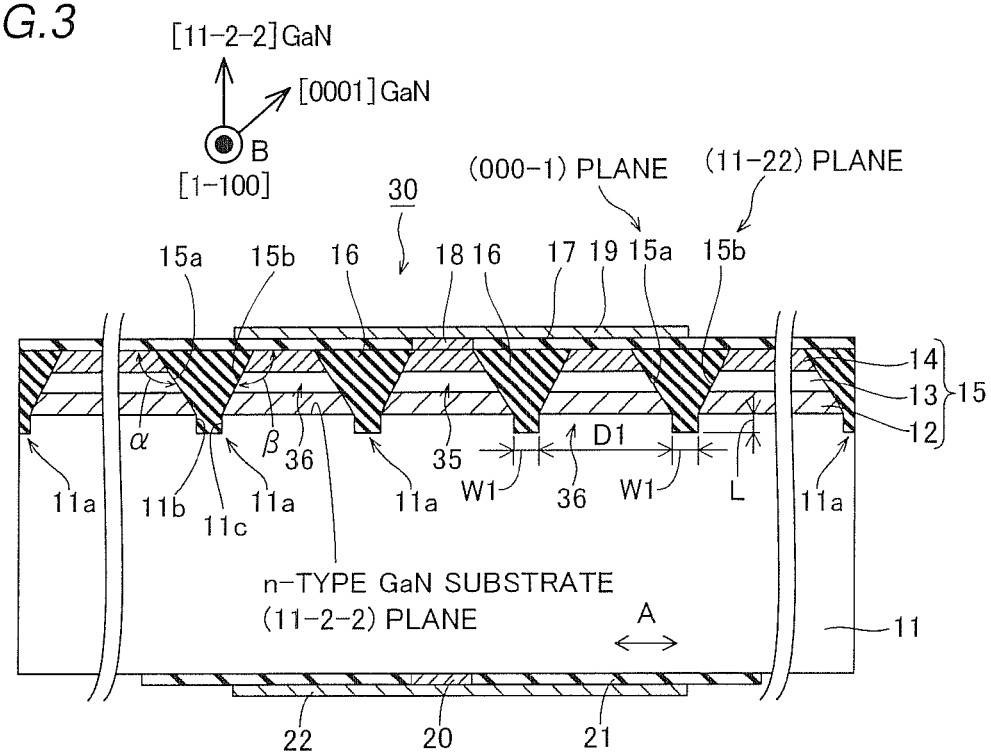
FIG. 3 is a sectional view showing a structure of a nitride-based semiconductor laser device according to a first embodiment according to the present invention.

Thereafter, the insulating films 16 are so formed as to fill up the recess portions 11a and the portions between the first and second side surfaces 15a and 15b, as shown in FIG. 3. Then the current blocking layer 17 is formed on the insulating films 16 and the light-emitting device layer 15, and the p-side ohmic electrode 18 is formed only on the ridge 35. Thereafter, the p-side pad electrode 19 is formed on the p-side ohmic electrode 18.

The n-side ohmic electrode 20 is formed on the region, corresponding to the regions formed with the p-side ohmic electrode 18, of the lower surface of the n-type GaN substrate 11, and the insulating films 21 are formed around the n-side ohmic electrode 20. Then, the n-side pad electrode 22 is formed on the n-side ohmic electrode 20. Thereafter, cavity facets are formed by the (1-100) plane and the (-1100) plane by cleavage. Finally, the n-type GaN substrate 11 is divided along bottom portions of the recess portions 11a shown by the device dividing surfaces 900 shown in FIG. 6 in the plurality of recess portions 11a so as to include the one ridge 35 and the plurality of dummy ridges 36, thereby forming a plurality of nitride-based semiconductor laser devices 30 separated into chips.

According to the first embodiment, as hereinabove described, the light-emitting device layer 15 is formed on the main surface of the n-type GaN substrate 11 formed with the recess portions 11a, whereby when growing the light-emitting device layer 15, the first side surface 15a formed by the (000-1) plane, having excellent flatness, can be formed starting from one of the recess portions 11a in the adjacent two recess portions 11a, and the second side surface 15b having excellent flatness can be formed starting from the other recess portion 11a in the adjacent two recess portions 11a. The ridge 35 having the optical waveguide is formed by the region held between these first and second side surfaces 15a and 15b having flatness, whereby the nitride-based semiconductor laser device 30 having the optical waveguide, side surfaces of which have excellent flatness, can be obtained dissimilarly to a case of forming the optical waveguide by dry etching. Thus, the nitride-based semiconductor laser device 30 having a stable horizontal transverse mode can be obtained. Further, the horizontal transverse mode is stabilized, and hence a FFP can be inhibited from being asymmetric, and kink (nonlinearity) in I-L characteristics can be inhibited from occurrence.

The manufacturing process according to the first embodiment comprises a step of growing the light-emitting device layer 15 including the first and second side surfaces 15a and 15b composed of the facets formed while growing starting from the inner side surfaces 11b and 11c of the recess portions 11a formed on the main surface of the n-type GaN substrate 11. Thus, when the light-emitting device layer 15 is grown on the n-type GaN substrate 11, the growth rate of forming facets (the first and second side surfaces 15a and 15b) starting from the inner side surface 11a and 11b respectively is slower than the growth rate of growing the upper surface (main surface of the light-emitting device layer 15) of the growth layer, and hence the upper surface (main surface) of the growth layer is grown while maintaining flatness. Thus, flatness of the surface of the light-emitting device layer 15 having the emission layer 13 can be more improved as compared with surfaces of a growth layer of a light-emitting device layer with no side surfaces formed by the aforementioned facets.

According to the first embodiment, the first and second side surfaces 15a and 15b are formed by the crystal growth facets of the light-emitting device layer 15, whereby the ridge 35 having the optical waveguide can be formed simultaneously with crystal growth of the light-emitting device layer 15. Thus, the optical waveguide can be formed without dry etching, and hence the manufacturing process can be simplified and the light-emitting device layer 15 can be prevented from damage by dry etching. Accordingly, deterioration of performance of the nitride-based semiconductor laser device 30 due to damage by etching can be suppressed.

According to the first embodiment, the first and second side surfaces 15a and 15b formed by the (000-1) and (11-22) planes are formed, whereby the inclination angles α (about 122°) of the first side surfaces 15a formed by the (000-1) plane and the inclination angle β (about 116°) of the second side surfaces 15b can be close to the same. Thus, the shape of the optical waveguide formed by the region held between the first and second side surfaces can be nearly symmetric to each other, and hence the horizontal transverse mode can be further stabilized.

According to the first embodiment, in the light-emitting device layer 15, the first and second side surfaces 15a and 15b is formed while being inclined with respect to the main surface of the substrate so that the plane area of the light-emitting device layer 15 is reduced in a direction ([11-2-2] direction) away from the n-type GaN substrate 11 along a direction of stacking of the light-emitting device layer 15, whereby regions where no light-emitting device layer 15 exists by the first side surfaces 15a and the second side surfaces 15b (regions where the first side surfaces 15a and the second side surfaces 15b are opposed to each other in a wafer state (see FIG. 6)) is formed on the surface of the light-emitting device layer 15 on a side opposite to the n-type GaN substrate 11, and hence the wafer can be easily divided between the first side surfaces 15a and the second side surfaces 15b when the nitride-based semiconductor laser device 30 is separated into chips.

According to the first embodiment, the first and second side surfaces 15a and 15b are formed by the inclined planes inclined by about 58° and about 64° with respect to the main surface ((11-2-2) plane) of the light-emitting device layer 15, whereby the first and second side surfaces 15a and 15b holding the recess portions 11a therebetween extend in a direction away from each other, and hence the first and second side surfaces 15a and 15b can be easily inhibited from coming close to each other.

According to the first embodiment, the first and second side surfaces 15a and 15b are formed so as to form the obtuse angles (angles α and β (see FIG. 3)) with respect to the main surface of the light-emitting device layer 15, whereby the first side surfaces 15a and the second side surfaces 15b can be inhibited from coming close to each other, and hence the device can be easily divided between the first and second side surfaces 15a and 15b when separating the device into chips.

According to the first embodiment, the n-type GaN substrate 11 is employed as the substrate, whereby the first and second side surfaces 15a and 15b can be easily formed when growing the light-emitting device layer 15 made of AlGaN on the surface of the n-type GaN substrate 11.

Second Embodiment

Figure 7:
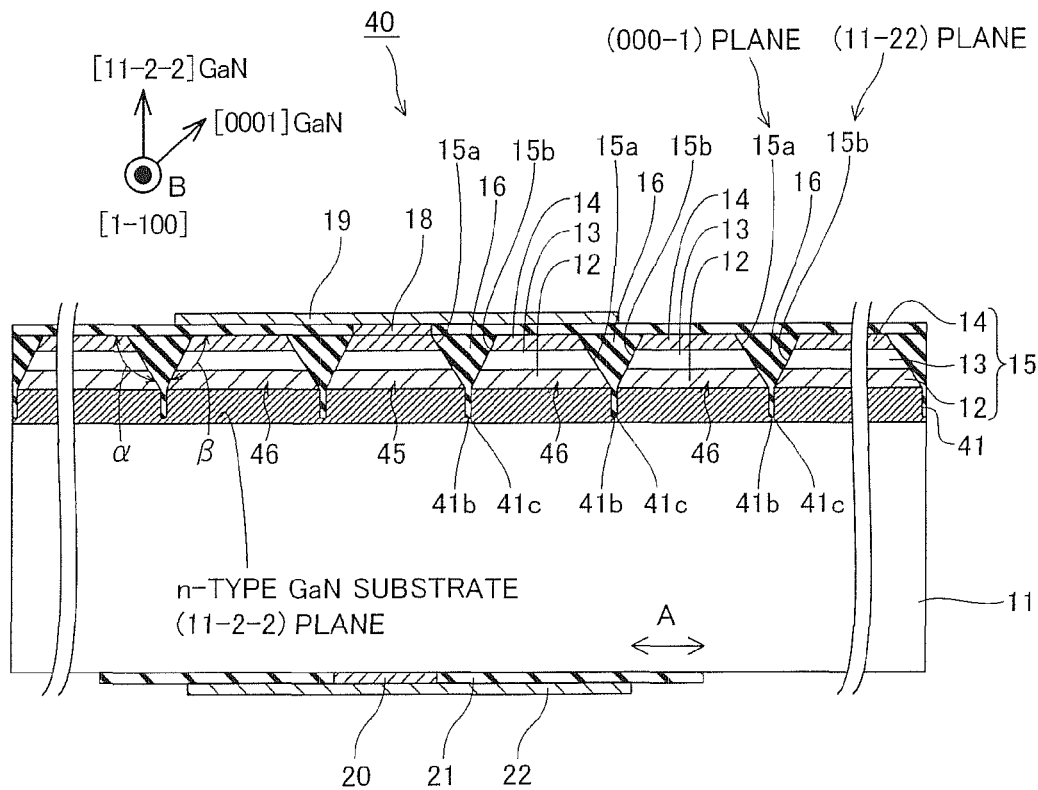
FIG. 7 is a sectional view showing a structure of a nitride-based semiconductor laser device according to a second embodiment of the present invention.

According to a second embodiment, a light-emitting device layer 15 is formed after forming an underlayer 41 on an n-type GaN substrate 11 dissimilarly to the aforementioned first embodiment, which will be hereinafter described with reference to FIG. 7.

In a nitride-based semiconductor laser device 40 according to the second embodiment, the underlayer 41 made of $Al_{0.05}Ga_{0.95}N$ having a thickness of about 3 to 4 μm is formed on the n-type GaN substrate 11. On this underlayer 41, a plurality of groove-shaped cracks 41a are so formed as to extend in a direction B. The cracks 41a are examples of the "recess portion" in the present invention. The n-type GaN substrate 11 according to the second embodiment is an example of the "base substrate" in the present invention.

The light-emitting device layer 15 including an n-type cladding layer 12, an emission layer 13, a p-type cladding layer 14 is formed on the underlayer 41. According to the second embodiment, first and second side surfaces 15a and 15b are formed starting from inner side surfaces 41b and 41c of the cracks 41a respectively and a ridge 45 and a plurality of dummy ridges 46 are formed by regions held between the first and second side surfaces 15a and 15b, similarly to the aforementioned first embodiment. The structure, other than the aforementioned structure, of the second embodiment is similar to that of the aforementioned first embodiment.

A manufacturing process for the nitride-based semiconductor laser device 40 according to the second embodiment will be now described with reference to FIGS. 7 to 10.

Figure 8:
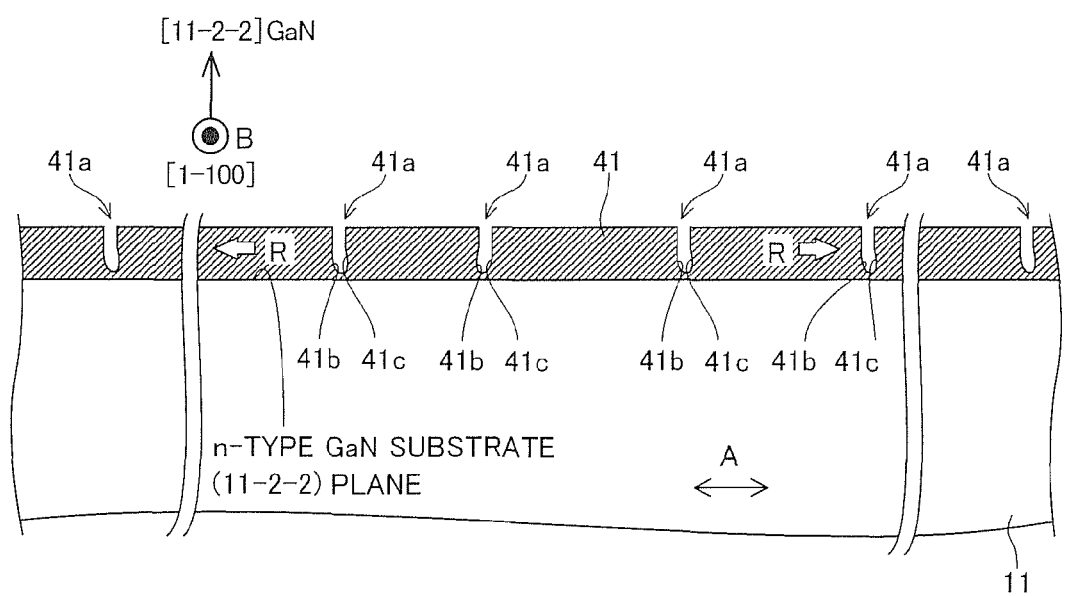
FIG. 8 is a sectional view for illustrating a manufacturing process for the nitride-based semiconductor laser device according to the second embodiment shown in FIG. 7.

First, the underlayer 41 made of $Al_{0.05}Ga_{0.95}N$ having a thickness of about 3 to about 4 μm is grown on the n-type GaN substrate 11. A lattice constant of the n-type GaN substrate 11 is smaller than a lattice constant of the underlayer 41 made of $Al_{0.05}Ga_{0.95}N$, and hence tensile stress R is caused inside the underlayer 41, a thickness of which reaches a prescribed thickness, in response to the lattice constant of the n-type GaN substrate 11. Consequently, the cracks 41a as shown in FIG. 8 are formed on the underlayer 41 following to local contraction of the underlayer 41 in a direction A. Difference between c-axial lattice constants of GaN and AlGaN is larger than difference between a-axial lattice constants of GaN and AlGaN, and hence the cracks 41a are likely to be formed to extend in a [1-100] direction parallel to a (000-1) plane of the underlayer 41 and a (11-2-2) plane of the main surface of the n-type GaN substrate 11. FIG. 8 schematically shows a state of voluntarily forming the cracks 41a on the underlayer 41.

Figure 9:
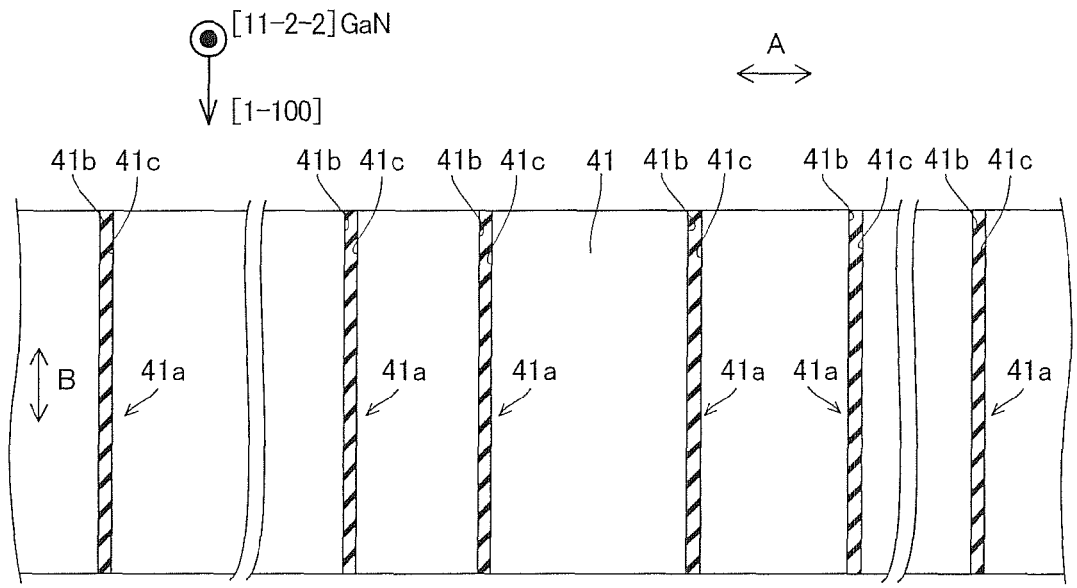
FIG. 9 is a plan view for illustrating the manufacturing process for the nitride-based semiconductor laser device according to the second embodiment shown in FIG. 7.

When the underlayer 41 formed with the cracks 41a is viewed in a planar manner, the cracks 41a are formed in a striped manner along the [1-100] direction (direction B) substantially orthogonal to the [0001] direction (direction A) of the n-type GaN substrate 11, as shown in FIG. 9.

Figure 10:
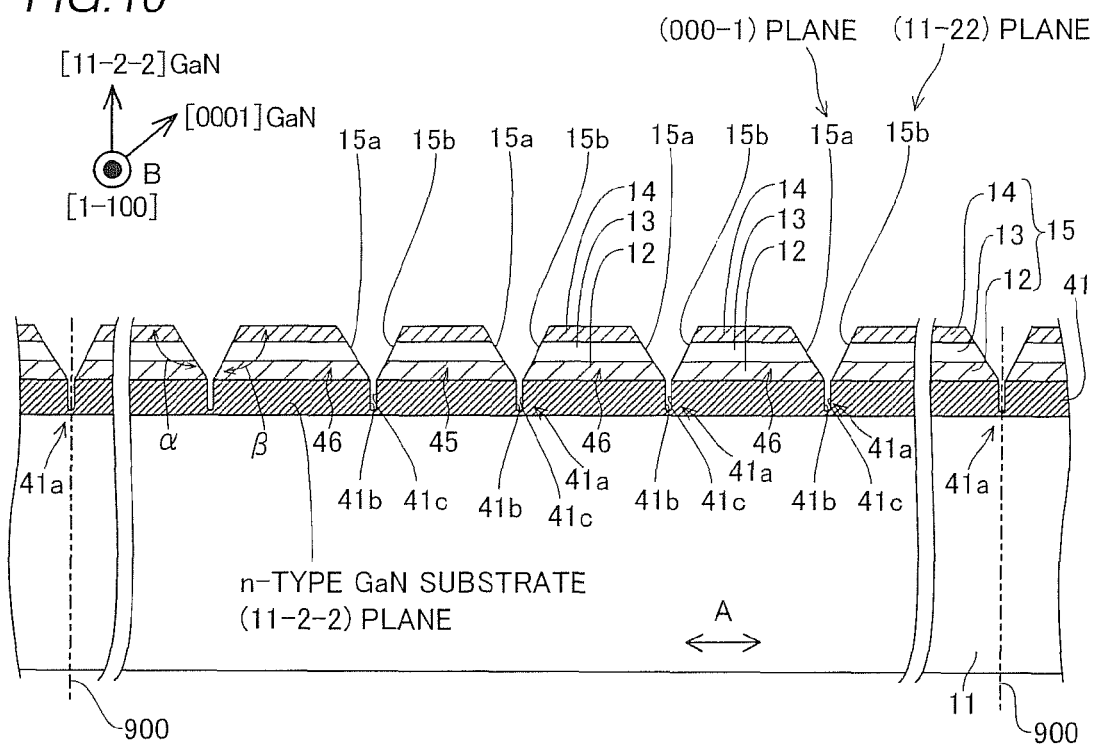
FIG. 10 is a sectional view for illustrating the manufacturing process for the nitride-based semiconductor laser device according to the second embodiment shown in FIG. 7.

Thereafter, the light-emitting device layer 15 is formed on the underlayer 41 through a manufacturing process similar to that of the aforementioned first embodiment. At this time, according to the second embodiment, the light-emitting device layer 15 is grown on the inner side surfaces 41b of the cracks 41a extending in the [1-100] direction (direction B in FIG. 4) while forming crystal growth facets formed by the (000-1) plane extending in a direction inclined by a prescribed angle with respect to a [11-2-2] direction of the n-type GaN substrate 11, as shown in FIG. 10. The light-emitting device layer 15 is grown on the inner side surfaces 41c of the cracks 41a while forming crystal growth facets formed by the (11-22) plane extending in a direction inclined by a prescribed angle with respect to the [11-2-2] direction of the n-type GaN substrate 11. Thus, the first and second side surfaces 15a and 15b are formed so as to form obtuse angles (inclination angles α and β) with respect to the upper surface (main surface) of the light-emitting device layer 15. According to the second embodiment, the single ridge 45 and the plurality of dummy ridges 46 are formed by the regions held between the first side surfaces 15a formed starting from the inner side surfaces 41b of ones of the cracks 41a in the adjacent cracks 41a and the second side surfaces 15b formed starting from the inner side surfaces 41c of the other cracks 41a in the adjacent cracks 41a.

Thereafter, an isulating layer 16, a current blocking layer 17, a p-side ohmic electrode 18, a p-side pad electrode 19, an n-side ohmic electrode 20, an insulating layer 21 and an n-side pad electrode 22 are formed and device division is performed, thereby forming the nitride-based semiconductor laser device 40 according to the second embodiment, similarly to the manufacturing process of the aforementioned first embodiment.

According to the second embodiment, as hereinabove described, the underlayer 41 made of AlGaN is formed on the n-type GaN substrate 11, whereby the lattice constant of the underlayer 41 is smaller than the lattice constant of the n-type GaN substrate 11 and hence and hence tensile stress can be caused inside the underlayer 41 when forming the underlayer 41 made of AlGaN on the n-type GaN substrate 11. The cracks 41a as recess portions can be easily formed on the surface of the underlayer 41 by this tensile stress. The first and second side surfaces 15a and 15b are formed starting from the inner side surfaces 41b and 41c of the cracks 41a formed to extend substantially parallel to the (000-1) plane of the underlayer 41 and the main surface of the n-type GaN substrate 11, whereby the flat first and second side surfaces 15a and 15b can be formed without etching the recess portions. The remaining effects of the second embodiment are similar to those of the aforementioned first embodiment.

Third Embodiment

Figure 11:
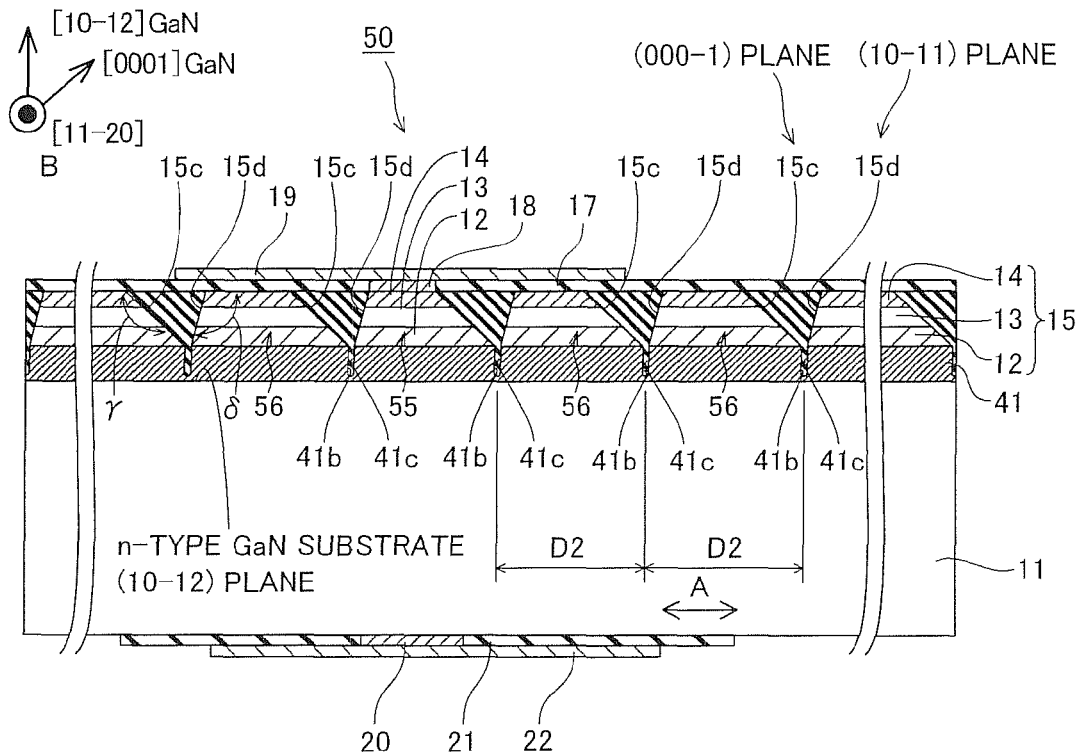
FIG. 11 is a sectional view showing a structure of a nitride-based semiconductor laser device according to a third embodiment of the present invention.

According to a third embodiment, scribing cracks 41e are formed on an underlayer 41 so that formation positions of cracks 41a are controlled dissimilarly to the aforementioned second embodiment, which will be hereinafter described with reference to FIG. 11.

A nitride-based semiconductor laser device 50 according to the third embodiment is formed by employing a wurtzite nitride semiconductor having a main surface formed by a (10-12) plane. According to the third embodiment, on the underlayer 41, a plurality of the groove-shaped cracks 41a are formed at an interval D2 to extend in a direction B. According to the third embodiment, first side surfaces 15c formed by a (000-1) plane of the light-emitting device layer 15 and second side surfaces 15d formed by a (10-11) plane of the light-emitting device layer 15 are formed on the light-emitting device layer 15 to extend in a [11-20] direction. The first and second side surfaces 15c and 15d are inclined to sides opposite to each other, and the first and second side surfaces 15c and 15d are inclined by inclination angles γ (obtuse angle of about 137°) and δ (obtuse angle of about 105°) with respect to an upper surface (main surface) of the light-emitting device layer 15, respectively. According to the third embodiment, a ridge 55 and a plurality of dummy ridges 56 of the nitride-based semiconductor laser device 50 are formed by regions held between the first side surfaces 15c formed starting from the inner side surfaces 41b of ones of the cracks 41a in the adjacent cracks 41a and the second side surfaces 15d formed starting from the inner side surfaces 41c of the other cracks 41a in the adjacent cracks 41a.

The structure, other than the aforementioned structure, of the nitride-based semiconductor laser device 50 according to the third embodiment is similar to that of the aforementioned second embodiment.

A manufacturing process for the nitride-based semiconductor laser device 50 according to the third embodiment will be now described with reference to FIGS. 11 to 13.

As the manufacturing process for the nitride-based semiconductor laser device 50 according to the third embodiment, the underlayer 41 having a critical thickness smaller than the thickness of the underlayer 41 formed in the aforementioned second embodiment is grown on an n-type GaN substrate 11. At this time, tensile stress is caused inside the underlayer 41. The critical thickness means a minimum thickness of the underlayer 41, not causing cracks 41a due to difference in lattice constants when forming the underlayer 41 on the n-type GaN substrate 11.

Thereafter, the skipped scribing cracks 41e are formed on the underlayer 41 in the [11-20] direction (direction B) orthogonal to the direction A at an interval of about 50 μm by a laser beam or a diamond point. A plurality of the scribing cracks 41e are formed in the direction A at an interval D2. Thus, formation of the cracks 41a proceeds in the [11-20] direction (direction B), in which the scribing cracks 41e are formed, starting from the skipped scribing cracks 41e, as shown in FIG. 13. In the scribing cracks 41e, the formation of the cracks 41a proceeds also in a depth direction. Thus, the cracks 41a reaching in the vicinity of an interface between the n-type GaN substrate 11 and the underlayer 41 are formed. Then, the light-emitting device layer 15 having the first side surfaces 15c formed by the (000-1) plane of the light-emitting device layer 15 and the second side surfaces 15d formed by the (10-11) plane of the light-emitting device layer 15 is formed through a manufacturing process similar to that of the aforementioned second embodiment. Thereafter, the nitride-based semiconductor laser device 50 according to the third embodiment is formed through the manufacturing process similar to that of the aforementioned second embodiment.

According to the third embodiment, as hereinabove described, the second side surfaces 15d are formed by the (10-11) plane, whereby the second side surfaces 15d formed by the (10-11) plane can be easily formed in addition to the first side surfaces 15c formed by the (000-1) plane by growing the light-emitting device layer 15 on the surface of the n-type GaN substrate 11 on which the cracks 41a are formed.

According to the third embodiment, the skipped scribing cracks 41e are formed after forming the underlayer 41 having the critical thickness on the n-type GaN substrate 11, whereby the formation of the cracks 41a can proceed along an extensional direction of the scribing cracks 41e. Thus, the formation positions of the cracks 41a can be controlled, and hence the formation positions of the first and second side surfaces 15c and 15d formed starting from the inner side surfaces 41b and 41c of the cracks 41a can be controlled. Thus, the size of the ridge 55 having the optical waveguide can be controlled, and hence the nitride-based semiconductor laser device 50 having the same emission area can be formed also when the ridge 55 is formed by utilizing the cracks 41a. The remaining effects of the third embodiment are similar to those of the aforementioned second embodiment.

Fourth Embodiment

Figure 14:
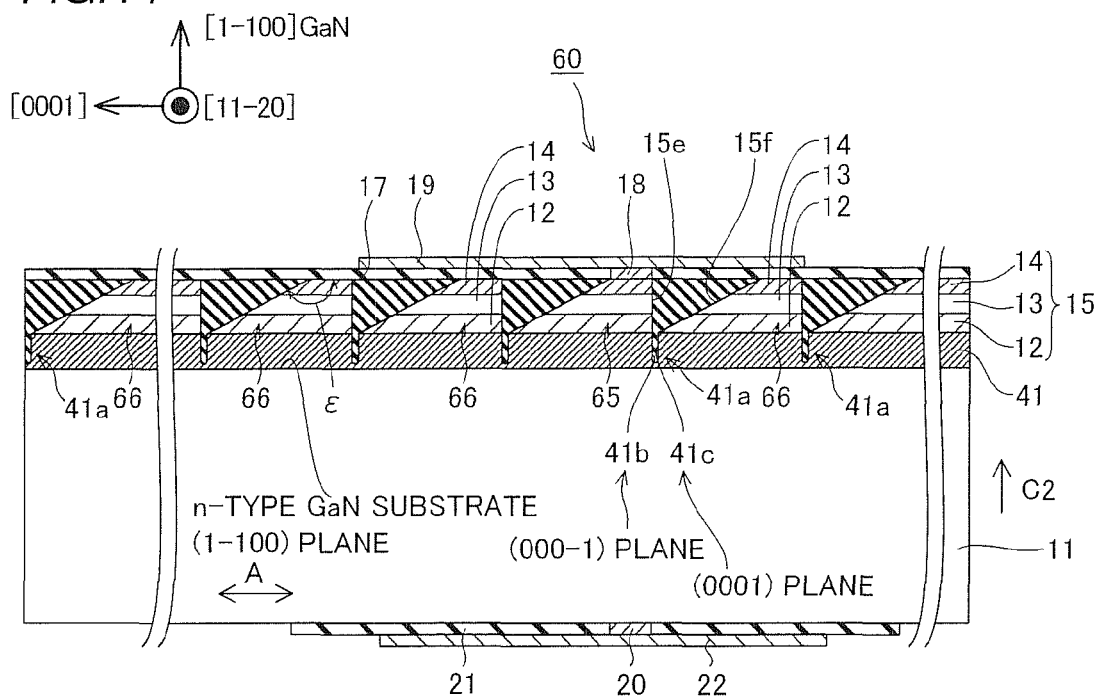
FIG. 14 is a sectional view showing a structure of a nitride-based semiconductor laser device according to a fourth embodiment of the present invention.

According to a fourth embodiment, an underlayer 41 and a light-emitting device layer 15 are formed on an m-plane ((1-100) plane) of an n-type GaN substrate 11 dissimilarly to the aforementioned second embodiment, which will be hereinafter described with reference to FIG. 14.

A nitride-based semiconductor laser device 60 according to the fourth embodiment is formed by employing a wurtzite nitride semiconductor having a main surface formed by the (1-100) plane. According to the fourth embodiment, first side surfaces 15e formed by a (000-1) plane of the light-emitting device layer 15 and second side surfaces 15f formed by a (10-11) plane of the light-emitting device layer 15 are formed on the light-emitting device layer 15 to extend in a [11-20] direction. The second side surfaces 15f are inclined by inclination angle ϵ (obtuse angle of about 152°) with respect to an upper surface (main surface) of the light-emitting device layer 15. According to the fourth embodiment, a ridge 65 and a plurality of dummy ridges 66 of the nitride-based semiconductor laser device 60 are formed by regions held between the first side surfaces 15e formed starting from inner side surfaces 41b of ones of cracks 41a in the adjacent cracks 41a and the second side surfaces 15f formed starting from inner side surfaces 41c of the other cracks 41a in the adjacent cracks 41a.

The structure, other than the aforementioned structure, of the nitride-based semiconductor laser device 60 according to the fourth embodiment is similar to that of the aforementioned second embodiment.

A manufacturing process for the nitride-based semiconductor laser device 60 according to the fourth embodiment will be now described with reference to FIG. 15.

Figure 15:
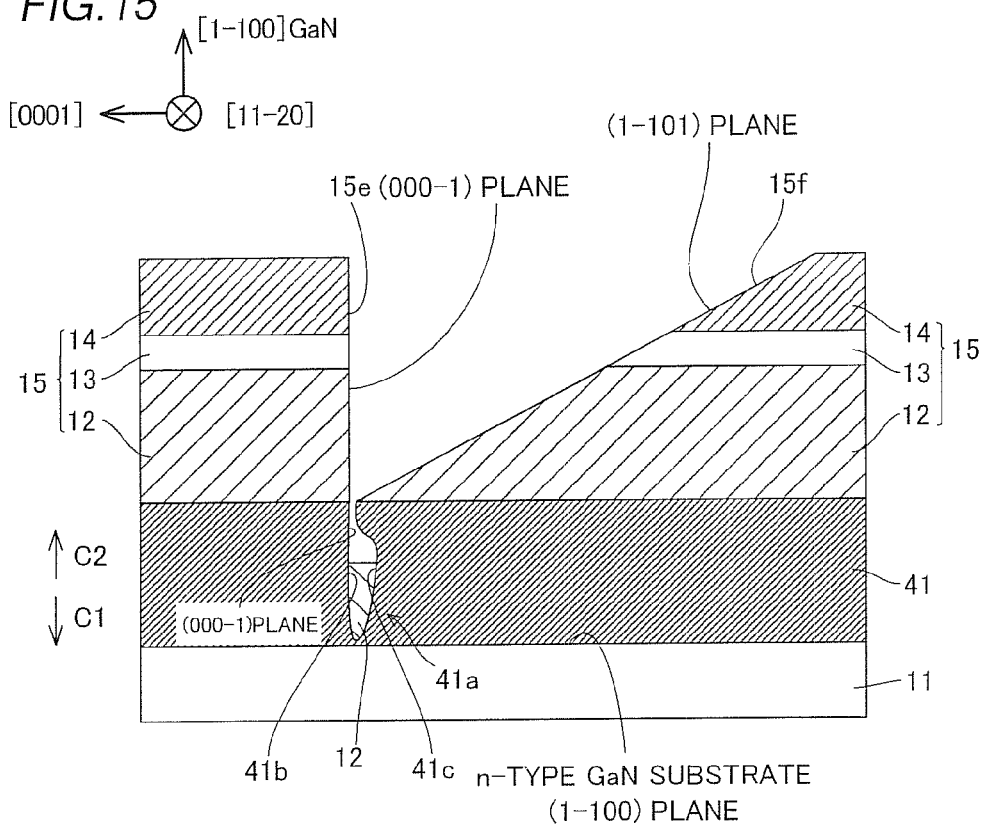
FIG. 15 is a sectional view for illustrating a manufacturing process of the nitride-based semiconductor laser device according to the fourth embodiment of the present invention.

According to the fourth embodiment, the light-emitting device layer 15 is grown starting from the inner side surfaces 41b formed by the (000-1) plane of the cracks 41a extending in a [11-20] direction (direction B), while forming facets formed by the (000-1) plane to start from the (000-1) plane of the cracks 41a, as shown in FIG. 15. Further, the light-emitting device layer 15 is grown starting from the inner side surfaces 41c of the cracks 41a, while forming facets formed by a (1-101) plane extending in a direction inclined by a prescribed angle with respect to the [1-100] direction of the n-type GaN substrate 11. Thus, the first side surfaces 15e are formed so as to form a right angle with respect to the upper surface (main surface) of the light-emitting device layer 15, and the second side surfaces 15f are formed so as to form an obtuse angle (inclination angle ϵ) with respect to the upper surface (main surface) of the light-emitting device layer 15. According to the fourth embodiment, the ridge 65 and the plurality of dummy ridges 66 are formed by the regions held between the first side surfaces 15e formed starting from the inner side surfaces 41b of ones of the cracks 41a in the adjacent cracks 41a and the second side surfaces 15f formed starting from the inner side surfaces 41c of the other cracks 41a in the adjacent cracks 41a.

Thereafter, the nitride-based semiconductor laser device 60 according to the fourth embodiment is formed through a manufacturing process similar to that of the aforementioned second embodiment. The effects of the fourth embodiment are similar to those of the aforementioned second embodiment.

Example

Figure 16:
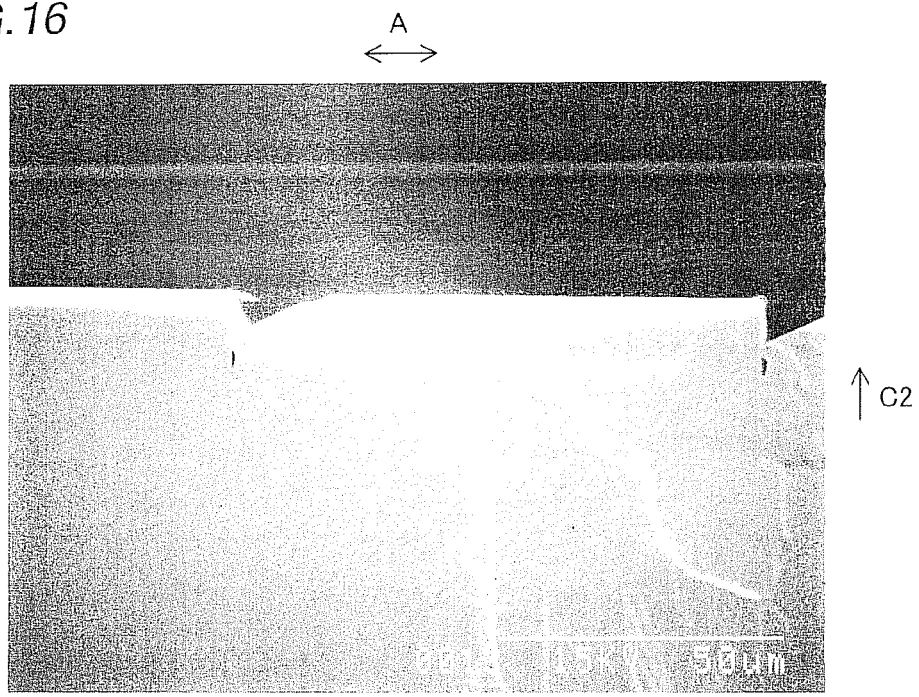
FIGS. 16 and 17 are photomicrographs of a cross section of a state of crystal growth of a semiconductor layer on an n-type GaN substrate in the nitride-based semiconductor laser device of the fourth embodiment shown in FIG. 14, observed by employing a scanning electron microscope.
Figure 17:
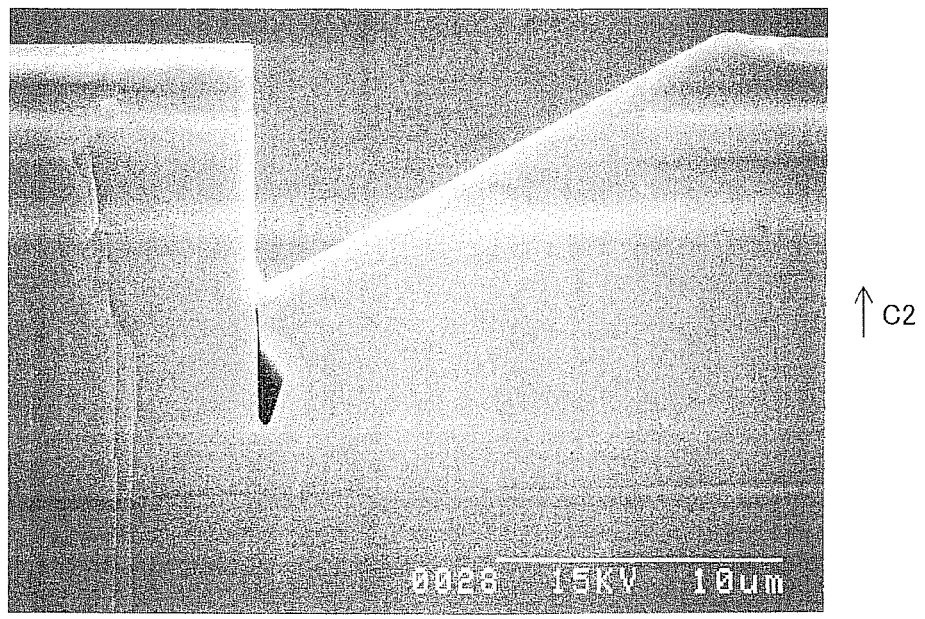

An experiment conducted for confirming the effects of the aforementioned fourth embodiment will be described with reference to FIGS. 9, 16 and 17.

In this confirmatory experiment, an underlayer made of AlGaN having a thickness of 3 μm to 4 μm was formed on an n-type GaN substrate having a main surface formed by an m-plane ((1-100) plane) by MOCVD through a manufacturing process similar to the manufacturing process of the aforementioned fourth embodiment. At this time, cracks as shown in FIGS. 16 and 17 were formed on the underlayer due to difference between lattice constants of the n-type GaN substrate and the underlayer. At this time, it has been confirmed that the crack formed a (000-1) plane extending in a direction perpendicular to the main surface of the n-type GaN substrate, as shown in FIG. 17. Further, it has been confirmed that the cracks were formed in a striped manner along a [11-20] direction (direction B) orthogonal to a [0001] direction (direction A) of the n-type GaN substrate, as shown in FIG. 9.

A semiconductor layer of GaN was epitaxially grown on the underlayer by MOCVD. Consequently, it has been confirmed that the semiconductor layer was grown on inner side surfaces formed by the (000-1) plane of the crack in a [1-100] (direction C2) direction while forming the (000-1) plane of GaN extending in a vertical direction so as to start from this surface orientation, as shown in FIG. 17. As shown in FIG. 17, it has been confirmed that inclined facets formed by the (10-11) plane of GaN were formed on inner side surfaces opposite to the (000-1) plane of the crack. It has been confirmed that these facets were formed so as to form an obtuse angle (about 152°) with respect to the upper surface (main surface) of the semiconductor layer. It has been confirmed that voids of the cracks reaching the n-type GaN substrate in forming the underlayer were partially filled up following lamination of the semiconductor layer.

Fifth Embodiment

Figure 18:
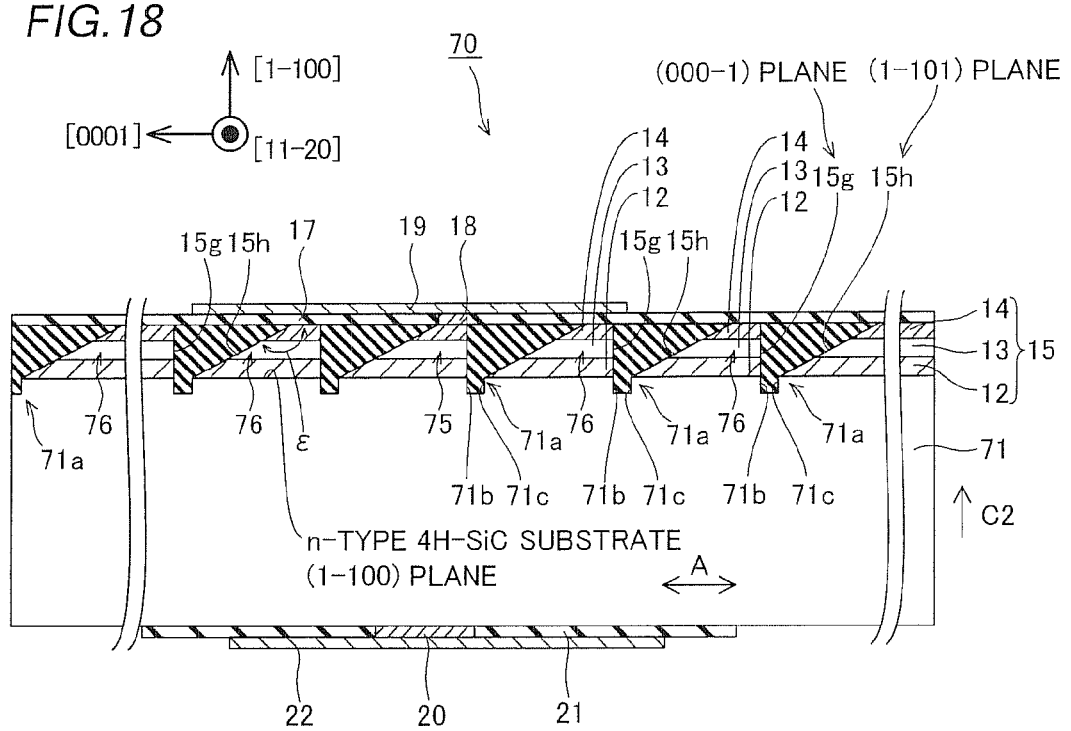
FIG. 18 is a sectional view showing a structure of a nitride-based semiconductor laser device according to a fifth embodiment of the present invention.

According to a fifth embodiment, a light-emitting device layer 15 is formed on an n-type 4H—SiC substrate 71 having a main surface formed by an m-plane ((1-100) plane) dissimilarly to the aforementioned first embodiment, which will be hereinafter described with reference to FIG. 18.

In a nitride-based semiconductor laser device 70 according to the fifth embodiment, first side surfaces 15g formed by a (000-1) plane of the light-emitting device layer 15 and second side surfaces 15h formed by a (1-101) plane of the light-emitting device layer 15 are formed on the light-emitting device layer 15 to extend in a [1-100] direction. A plurality of groove-shaped recess portions 71a are formed on an upper surface of the substrate 71 to extend in a [11-20] direction. The first and second side surfaces 15g and 15h are formed starting from inner side surfaces 71b and 71c on first and second sides of the recess portions 71a respectively. According to the fifth embodiment, a single ridge 75 and a plurality of dummy ridges 76 of the nitride-based semiconductor laser device 70 are formed by regions held between the first side surfaces 15a formed starting from the inner side surfaces 71b on the first sides of ones of the recess portions 71a in the adjacent recess portions 71a and the second side surfaces 15h formed starting from the inner side surfaces 71c on the second sides of the other recess portions 71a in the adjacent recess portions 71a.

The structure, other than the aforementioned structure, of the nitride-based semiconductor laser device 70 according to the fifth embodiment is similar to that of the aforementioned first embodiment. A manufacturing process for the nitride-based semiconductor laser device 70 according to the fifth embodiment is similar to that of the aforementioned first embodiment except that the light-emitting device layer 15 is formed on the n-type 4H—SiC substrate 71 having the main surface formed by the m-plane ((1-100) plane). The effects of the fifth embodiment are similar to those of the aforementioned first embodiment.

Sixth Embodiment

According to a sixth embodiment, dummy ridges 96 having width larger than a width of a ridge 95 are formed on both sides laterally of the single ridge 95 formed on a substantial center in a width direction of the device dissimilarly to the aforementioned first embodiment, which will be hereinafter described with reference to FIGS. 19 to 21. The dummy ridges 96 are examples of the "support portion" in the present invention.

Figure 21:
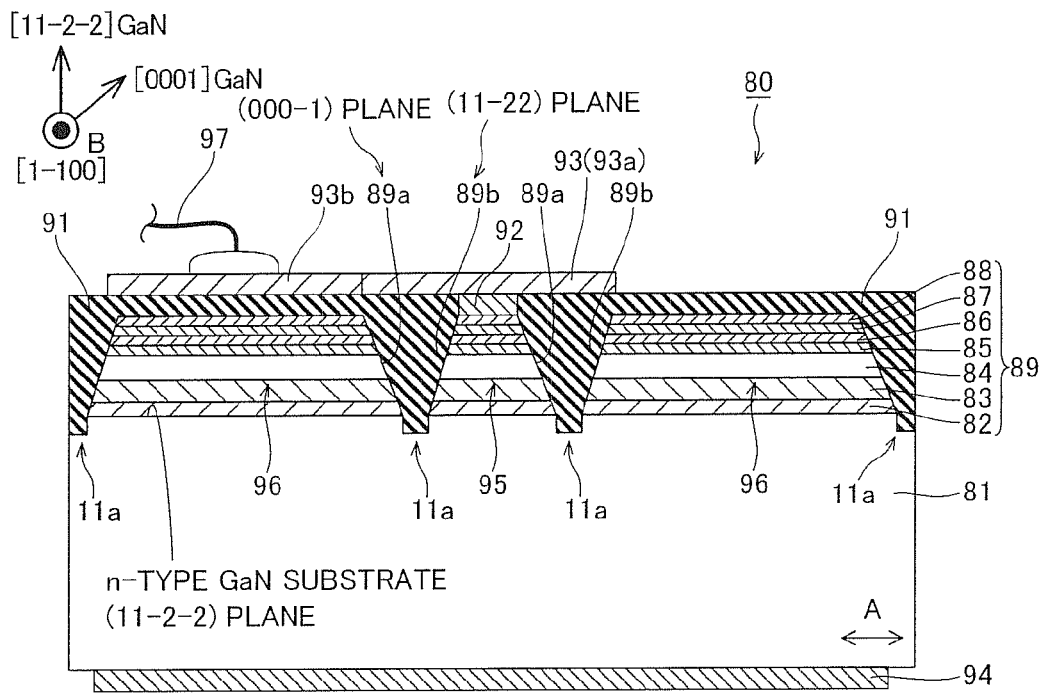
FIG. 21 is a sectional view taken along the line 1000-1000 in FIG. 20.

In a nitride-based semiconductor laser device 80 according to the sixth embodiment, a light-emitting device layer 89 including a buffer layer 82, an n-type cladding layer 83, an emission layer 84, a p-side guide layer 85, a carrier blocking layer 86, a p-type cladding layer 87 and a p-type contact layer 88 is formed on a (11-2-2) plane of an n-type GaN substrate 81 having a thickness of about 100 μm, as shown in FIG. 21. The n-type GaN substrate 81 is an example of the "substrate" in the present invention, and the light-emitting device layer 89 is an example of the "nitride-based semiconductor layer" in the present invention.

The buffer layer 82 is made of $Al_{0.01}Ga_{0.99}N$ having a thickness of about 1 μm, and the n-type cladding layer 83 is made of Ge-doped n-type $Al_{0.07}Ga_{0.93}N$ having a thickness of about 1.9 μm. The emission layer 84 has an MQW structure in which three well layers (not shown) made of $In_{0.15}Ga_{0.85}N$ having a thickness of about 2.5 nm and four barrier layers (not shown) made of GaN having a thickness of about 20 nm are alternately stacked.

The p-side guide layer 85 is made of $In_{0.01}Ga_{0.99}N$ having a thickness of about 80 nm, and the carrier blocking layer 86 is made of Mg-doped $Al_{0.25}Ga_{0.75}N$ having a thickness of about 20 nm. The p-type cladding layer 87 is made of Mg-doped p-type $Al_{0.07}Ga_{0.93}N$ having a thickness of about 0.5 μm, and the p-type contact layer 88 is made of Mg-doped p-type $In_{0.07}Ga_{0.93}N$ having a thickness of about 3 nm.

Figure 20:
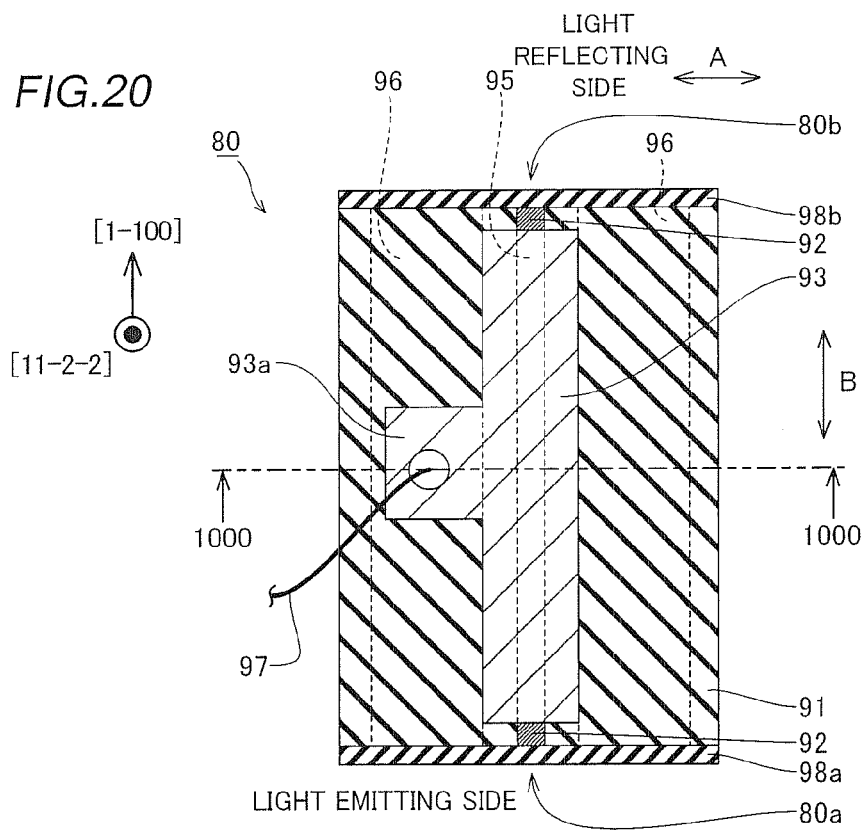
FIG. 20 is a plan view showing the structure of the nitride-based semiconductor laser device according to the sixth embodiment shown in FIG. 19.

According to the sixth embodiment, the single ridge 95 having a width of about 10 μm is formed on the substantial center of the nitride-based semiconductor laser device 80 in a direction A to extend in a [1-100] direction, as shown in FIG. 20. The two dummy ridges 96 having trapezoidal shapes with width of about 50 μm in the direction A are formed on the both sides laterally of the ridge 95 to hold the recess portions 11a between the dummy ridges 96 and the ridge 95 to extend in the [1-100] direction. In other words, in the manufacturing process of the sixth embodiment, the light-emitting device layer 89 is grown on a surface of the n-type GaN substrate 81 formed with the recess portions 11a after forming the plurality of recess portions 11a (see FIG. 21) on the n-type GaN substrate 81 at the intervals of about 10 μm and about 50 μm alternately, whereby the ridge 95 and the dummy ridges 96 having plane areas larger than the ridge 95 are formed.

The ridge 95 is formed to have a width in the range of about 5 to 100 μm by controlling the intervals for forming the recess portions 11a. In this case, each of the dummy ridges 96 is preferably formed to have a width in the range of about 50 to 200 μm.

According to the sixth embodiment, insulating films 91 made of $SiO_2$, filling up the recess portions 11a and doubling as a current blocking layer covering upper surfaces of the dummy ridges 96 are formed.

First side surfaces 89a formed by a (000-1) plane of the light-emitting device layer 89 and second side surfaces 89b formed by a (11-22) plane of the light-emitting device layer 89 are formed on side surfaces of the ridge 95 and the dummy ridges 96, respectively.

A p-side ohmic electrode 92 and a p-side pad electrode 93 similar to those of the first embodiment are formed so as to be in contact with the p-type contact layer 88 of the ridge 95. The p-side ohmic electrode 92 and the p-side pad electrode 93 are examples of the "ohmic electrode" and the "pad electrode" in the present invention respectively.

According to the sixth embodiment, the p-side pad electrode 93 has a wire bonding region 93a protruding in the direction A to be convexed on a substantially central region in a cavity direction (direction B) of the device in plan view, as shown in FIG. 20. In other words, when forming the p-side pad electrode 93 in the manufacturing process, the p-side pad electrode 93 is formed on the ridge 95 to have the wire bonding region 93a protruding in the direction A from a part of the electrode extending in the direction B by patterning. Thus, the wire bonding region 93a is so arranged as to overlap above the region where the dummy ridges 96 (see FIG. 21) on a first side is formed. Accordingly, a metal wire 97 made of Au is wire-bonded onto a portion of the wire bonding region 93a where impact force in wire-bonding is unlikely to directly influence the ridge 95, as shown in FIG. 21.

An n-side ohmic electrode 94 similar to that of the first embodiment is formed so as to cover a substantially overall lower surface of the n-type GaN substrate 81.

Figure 19:
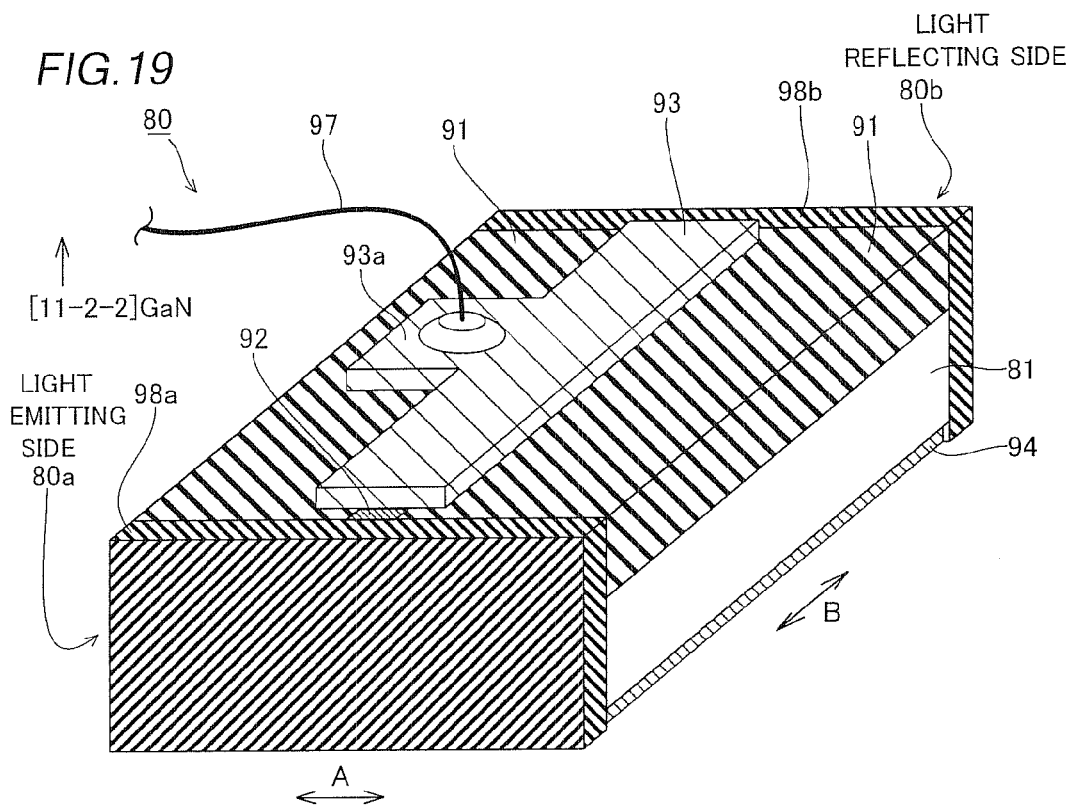
FIG. 19 is a bird's-eye view showing a structure of a nitride-based semiconductor laser device according to a sixth embodiment of the present invention.

As shown in FIGS. 19 and 20, facet protective films 98a and 98b of dielectric multilayer films are formed on cavity facets 80a and 80b formed by cleavage planes of (1-100) and (-1100) planes. When the cavity facet 80a is on a light emitting side, the facet protective film 98a is formed by an AlN film having a thickness of about 10 nm and an $Al_2O_3$ film having a thickness of about 150 nm outward from the cavity facet 80a. On the other hand, the facet protective film 98b formed on the cavity facet 80b on a light reflecting side is formed by an AlN film having a thickness of about 10 nm, an $Al_2O_3$ film having a thickness of about 30 nm, an AlN film having a thickness of about 10 nm, an $Al_2O_3$ film having a thickness of about 60 nm, an $SiO_2$ film having a thickness of about 140 nm and a multilayer reflector having a thickness of about 708 nm, formed by alternately stacked six $SiO_2$ films each having a thickness of about 68 nm as a low refractive index film and six $ZrO_2$ films each having a thickness of about 50 nm as a high refractive index film outward from the cavity facet 80b.

The structure and the manufacturing process, other than the aforementioned structure, of the nitride-based semiconductor laser device 80 according to the sixth embodiment are similar to those of the aforementioned first embodiment.

According to the sixth embodiment, as hereinabove described, the nitride-based semiconductor laser device 80 comprises the dummy ridges 96 having the plane areas larger than the plane area of the ridge 95, formed on sides opposite to the ridge 95 to hold the recess portions 11a between the dummy ridges 96 and the ridge 95, and extending along the recess portions 11a, and the p-side pad electrode 93 formed with the wire bonding region 93a extending in a region corresponding to the dummy ridge 96 from the surface of the p-side ohmic electrode 92, whereby the metal wire 97 can be easily wire-bonded onto the wire bonding region 93a corresponding to the dummy ridges 96 having the larger plane areas than the ridge 95. The wire-bonding position of the metal wire 97 is the region corresponding to the dummy ridge 96 different from a region corresponding to the ridge 95 in the p-side pad electrode 93, and hence impact force in wire-bonding can be inhibited from directly influencing the ridge 95.

According to the sixth embodiment, the ridge 95 and the dummy ridges 96 having different plane areas are formed on the light-emitting device layer 89, whereby it is reliably possible to distinguish the size of the ridge 95 from the size of each dummy ridge 96 in the manufacturing process. Thus, mask alignment with respect to the light-emitting device layer 89 can be easily performed when patterning the p-side pad electrode 93 having the wire bonding region 93a.

Modification of Sixth Embodiment

According to a modification of the sixth embodiment, a single dummy ridge 96a having a width larger than a width of a ridge 95 is formed on only on a first side laterally of the ridge 95 dissimilarly to the aforementioned sixth embodiment, which will be hereinafter described with reference to FIGS. 22 and 23. The dummy ridge 96a is an example of the "support portion" in the present invention.

Figure 23:
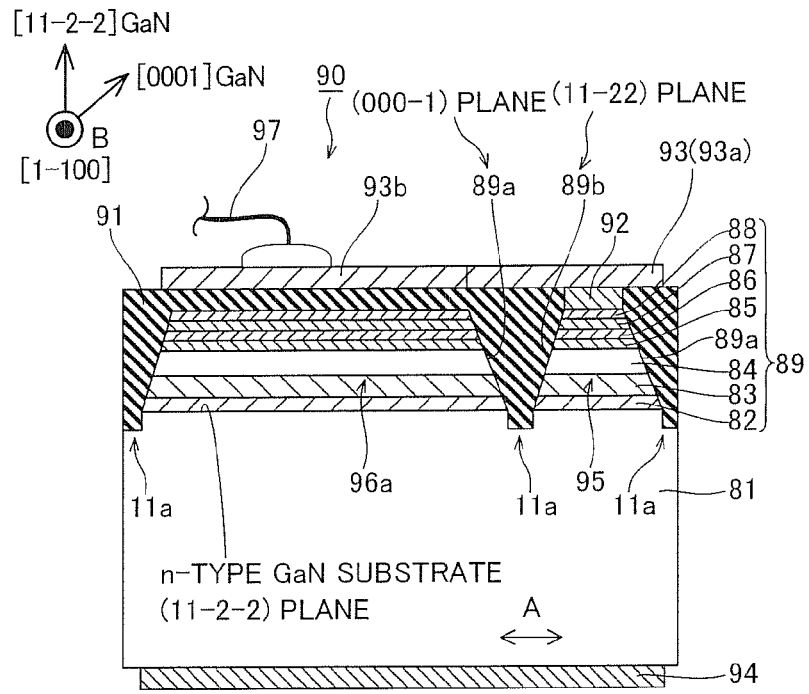
FIG. 23 is a sectional view taken along the line 1100-1100 in FIG. 22.

In a nitride-based semiconductor laser device 90 according to the modification of the sixth embodiment, the ridge 95 is formed to approach the first side of the device in a direction A and the single dummy ridge 96a having a width of about 200 μm is formed on a second side of the device in the direction A to hold the recess portion 11a between the ridge 95 and the dummy ridge 96a, as shown in FIG. 23.

Figure 22:
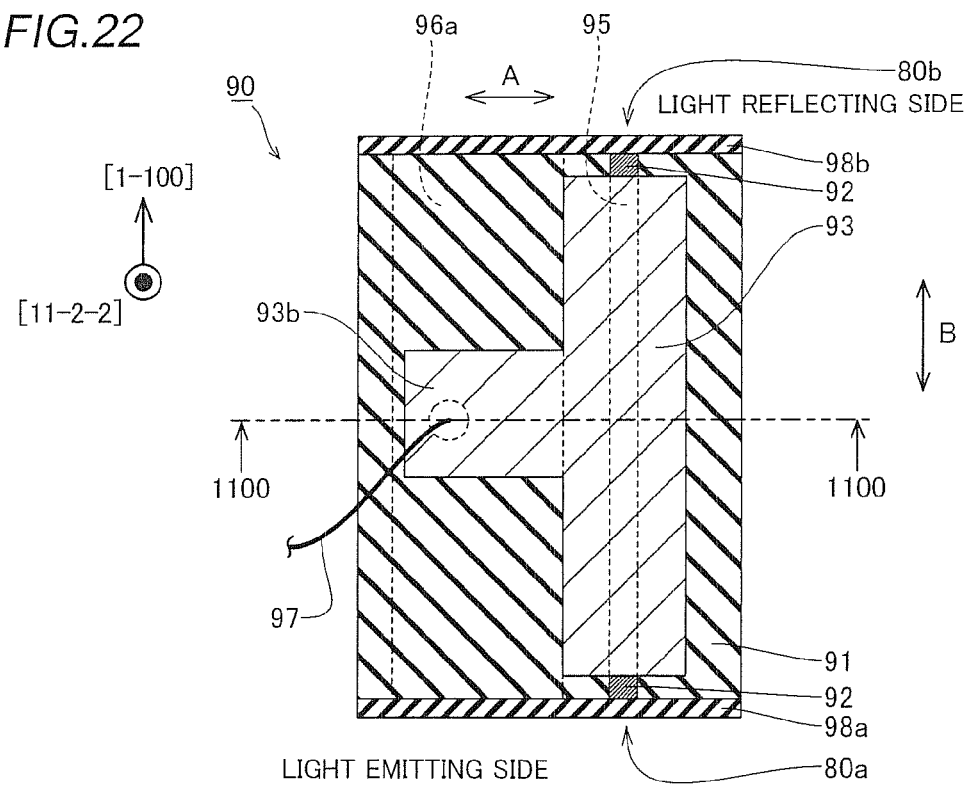
FIG. 22 is a plan view showing a structure of a nitride-based semiconductor laser device according to a modification of the sixth embodiment of the present invention.

As shown in FIG. 22, a wire bonding region 93b protruding from a substantial center in the direction A to be convexed is formed on a p-side pad electrode 93 formed along the ridge 95 when the nitride-based semiconductor laser device 90 is viewed in a planar manner. The wire bonding region 93b is so arranged as to overlap above a region where the dummy ridges 96a (see FIG. 23) are formed.

In the structure of the modification of the sixth embodiment, the single ridge 95 approaching the first side and the single dummy ridge 96a for the wire bonding region 93b, which is adjacent to the single ridge 95, are formed on a light-emitting device layer 89, thereby obtaining the effects similar to those of the aforementioned sixth embodiment. In other words, the number of the dummy ridges (support portions) in the single laser device chip is reduced, and hence the nitride-based semiconductor laser device 90 can be downsized.

Although the present invention has been described and illustrated in detail, it is clearly understood that the same is by way of illustration and example only and is not to be taken by way of limitation, the spirit and scope of the present invention being limited only by the terms of the appended claims.

For example, while the light-emitting device layer 15 is made of AlGaN, InGaN and GaN in the nitride-based semiconductor laser device according to each of the aforementioned first to sixth embodiments, the present invention is not restricted to this but the light-emitting device layer 15 may be formed by a wurtzite nitride-based semiconductor layer made of AlN, InN, BN, TlN or an alloyed semiconductor of these.

While the recess portions are formed on the main surface formed by the plane ((11-22) plane) of the n-type GaN substrate for growing the light-emitting device layer 15 in the nitride-based semiconductor laser device according to the aforementioned first embodiment, the present invention is not restricted to this but the recess portions may be formed on a main surface perpendicular to a (000±1) plane of the n-type GaN substrate such as the an m-plane ((1-100) plane) for forming the light-emitting device layer, for example.

While the cracks are voluntarily caused on the underlayer by utilizing difference between the lattice constants of the GaN substrate and the underlayer in the aforementioned fourth embodiment, the present invention is not restricted to this but the formation positions of the cracks may be controlled by forming skipped scribing cracks similarly to the aforementioned third embodiment.

While the GaN substrate is used as the substrate in each of the aforementioned first to fourth and sixth embodiments, the present invention is not restricted to this but an r-plane ((1-102) plane) sapphire substrate previously growing a nitride-based semiconductor having a main surface formed by an a-plane ((11-20) plane) or an a-plane SiC substrate or an m-plane SiC substrate previously growing a nitride-based semiconductor having a main surface formed by an a-plane ((11-20) plane) or an m-plane ((1-100) plane) may be employed, for example. Alternatively, a LiAlO$_2$ or LiGaO$_2$ substrate previously growing the aforementioned nonpolar nitride-based semiconductor may be employed.

While the n-type GaN substrate may be employed as the base substrate and the underlayer made of AlGaN is formed on the n-type GaN substrate in each of the aforementioned second to fourth embodiments, the present invention is not restricted to this but an InGaN substrate may be employed as the base substrate and an underlayer made of GaN or AlGaN may be formed on the InGaN substrate.

While the cracks are voluntarily formed on the underlayer by utilizing difference between the lattice constants of the n-type GaN substrate and the underlayer in each of the aforementioned second and fourth embodiments, the present invention is not restricted to this but scribing cracks may be formed only on both ends (regions corresponding to ends of the n-type GaN substrate 11 in the direction B) of the underlayer 41 (see FIG. 9) in the direction B (see FIG. 9). Also in this structure, cracks extending in the direction B can be introduced starting from the scribing cracks on the both ends.

Figure 12:
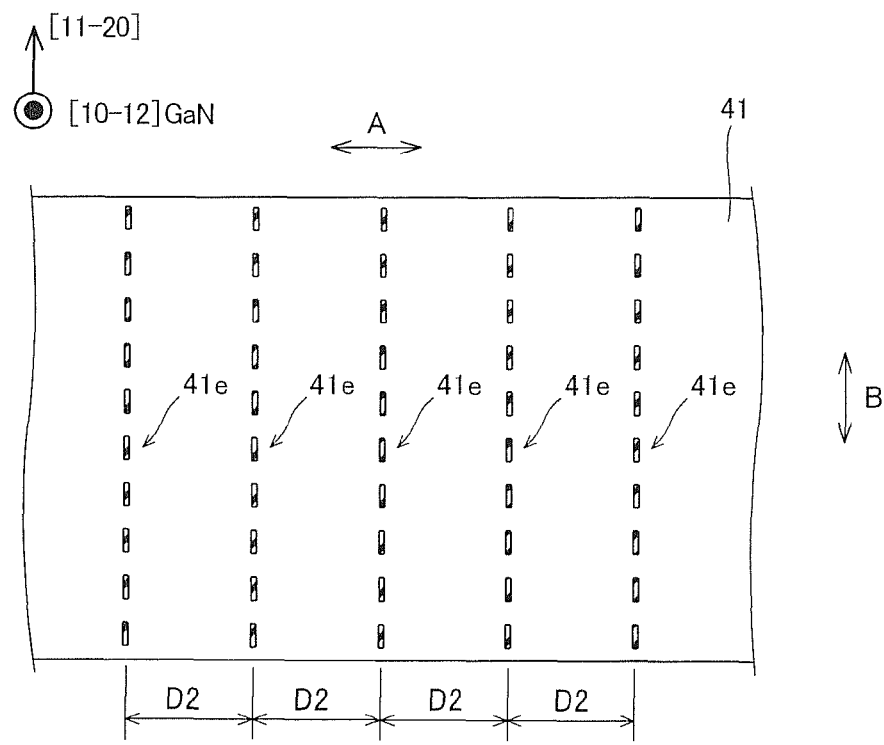
FIGS. 12 and 13 are plan views for illustrating a manufacturing process for the nitride-based semiconductor laser device according to the third embodiment shown in FIG. 11.
Figure 13:
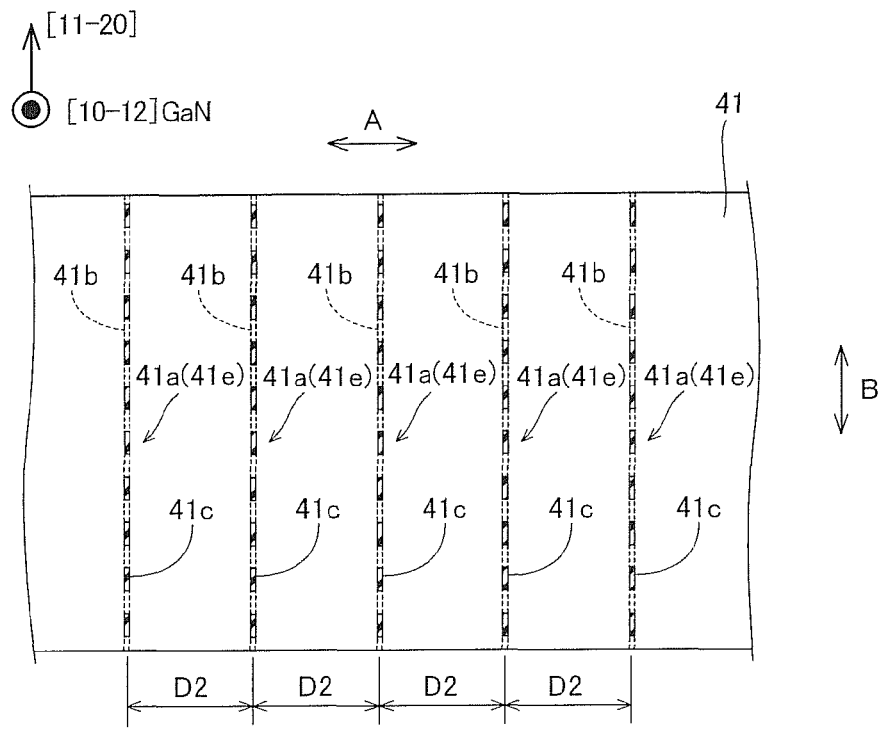

While the scribing cracks 41e for crack introduction are formed on the underlayer 41 in a skipped manner (at intervals of about 40 μm) in the aforementioned third embodiment, the present invention is not restricted to this but scribing cracks may be formed on the both ends (regions corresponding to the ends of the n-type GaN substrate 11) in the direction B of the underlayer 41 (see FIG. 12). Also in this structure, cracks extending in the direction B can be introduced starting from the scribing cracks on the both ends.

Figure 24:
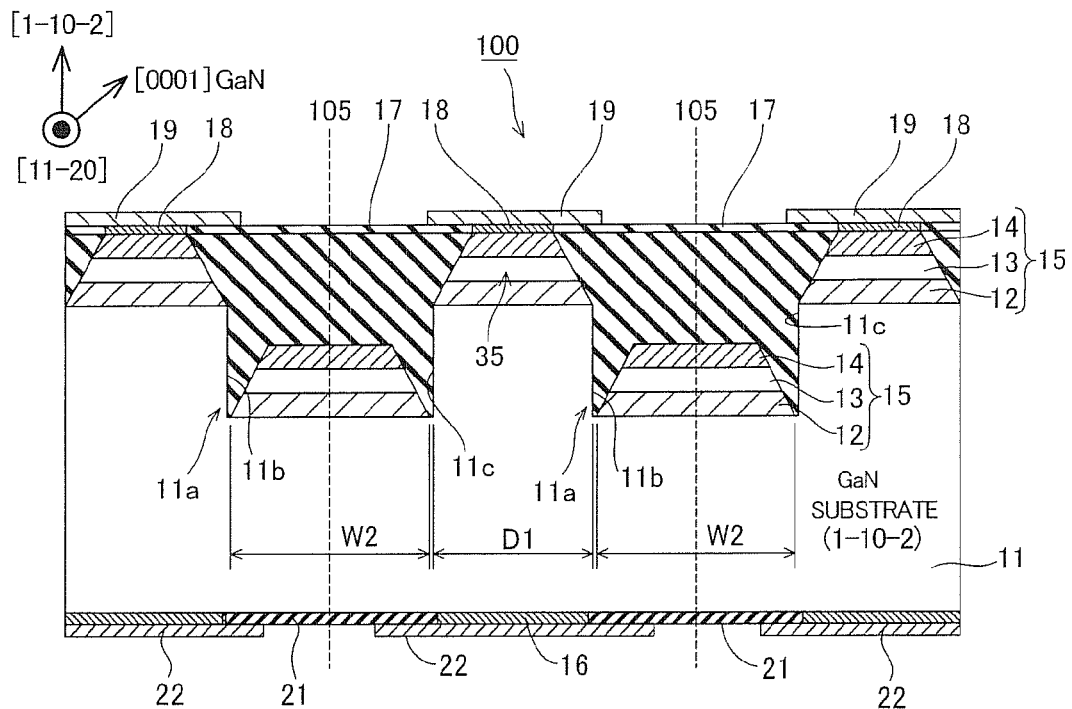
FIG. 24 is a sectional view showing a structure of a nitride-based semiconductor laser device according to a modification of the first embodiment of the present invention.

While the nitride-based semiconductor laser device 30 includes not only the ridge 35 used as the optical waveguide but also the plurality of dummy ridges 36 not used as the optical waveguides for simplifying handling of the nitride-based semiconductor laser device 30 since the width W1 of the recess portions 11a are small, 3 to 4 μm in the aforementioned first embodiment, the present invention is not restricted to this but a width W2 of recess portions 11a may be rendered larger, about 200 to 400 μm as in a nitride-based semiconductor laser device 100 according to a modification in FIG. 24. In this case, the device are divided at the central portions (section lines 105) of the recess portions, whereby the nitride-based semiconductor laser device 100 including a single ridge 35 and having a size enough to allow simple handling can be obtained.

What is claimed is:

1. A nitride-based semiconductor laser device comprising a nitride-based semiconductor layer formed on a main surface of a substrate and having an emission layer, wherein
said nitride-based semiconductor layer comprises:
a first side surface formed by a (000-1) plane, and
a second side surface inclined with respect to said first side surface, and
one or a plurality of ridges extending perpendicular to a [0001] direction in an in-plane direction of said main surface of said substrate is formed by a region held between said first side surface and said second side surface, and at least one said ridge has an optical waveguide.

2. The nitride-based semiconductor laser device according to claim 1, wherein a side surface of said optical waveguide is formed by at least one of said first side surface and said second side surface.

3. The nitride-based semiconductor laser device according to claim 1, wherein said first side surface and said second side surface are formed by crystal growth facets of said nitride-based semiconductor layer.

4. The nitride-based semiconductor laser device according to claim 1, wherein said second side surface is formed by a (A+B, A, −2A−B, 2A+B) plane (A and B satisfy A≧0 and B≧0, and either one of A and B is a nonzero integer).

5. The nitride-based semiconductor laser device according to claim 4, wherein said second side surface is formed by a (10-11) plane or a (11-22) plane.

6. The nitride-based semiconductor laser device according to claim 1, wherein at least one of said first side surface and said second side surface are inclined with respect to said main surface of said substrate so that a plane area of said nitride-based semiconductor layer is reduced in a direction away from said substrate along a direction of stacking of said nitride-based semiconductor layer, in said nitride-based semiconductor layer.

7. The nitride-based semiconductor laser device according to claim 1, wherein at least one of said first side surface and said second side surface is formed at a slant so as to form an obtuse angle with respect to a main surface of said nitride-based semiconductor layer.

8. The nitride-based semiconductor laser device according to claim 1, wherein said substrate is made of a nitride-based semiconductor.

9. The nitride-based semiconductor laser device according to claim 1, wherein at least two recess portions are formed on said main surface of said substrate,
said first side surface is formed starting from an inner side surface of one of said recess portions in two said recess portions adjacent to each other, and
said second side surface is formed starting from an inner side surface of the other said recess portion in said adjacent two recess portions.

10. The nitride-based semiconductor laser device according to claim 9, wherein said inner side surface of said one of said recess portions, formed with said first side surface includes a (000-1) plane.

11. The nitride-based semiconductor laser device according to claim 1, wherein a support portion is formed on said main surface of said substrate in a lateral direction from said ridge having said optical waveguide.

12. The nitride-based semiconductor laser device according to claim 11, said support portion has a plane area larger than a plane area of said ridge having said optical waveguide held between said first side surface and said second side surface.

13. The nitride-based semiconductor laser device according to claim 12, further comprising an ohmic electrode formed on a surface of said ridge having said optical waveguide; and
a pad electrode electrically connected to said ohmic electrode and extending on a portion from a surface of said ohmic electrode to said support portion.

14. The nitride-based semiconductor laser device according to claim 13, wherein
said pad electrode has a wire bonding region on said support portion.

15. The nitride-based semiconductor laser device according to claim 9,
said substrate includes a base substrate and an underlayer made of AlGaN formed on said base substrate,
a lattice constant of said base substrate is larger than a lattice constant of said underlayer,
said recess portions include cracks formed on said underlayer, and
said first side surface and said second side surface are formed starting from inner side surfaces of the cracks formed to extend substantially parallel to a (000-1) plane of said underlayer and said main surface of said substrate respectively.

* * * * *